(12) United States Patent
Yoshikawa et al.

(10) Patent No.: US 8,741,547 B2
(45) Date of Patent: Jun. 3, 2014

(54) MULTI CHARGED PARTICLE BEAM WRITING APPARATUS AND MULTI CHARGED PARTICLE BEAM WRITING METHOD

(71) Applicant: NuFlare Technology, Inc., Numazu (JP)

(72) Inventors: Ryoichi Yoshikawa, Kanagawa (JP); Munehiro Ogasawara, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 13/706,908

(22) Filed: Dec. 6, 2012

(65) Prior Publication Data

US 2013/0157198 A1    Jun. 20, 2013

(30) Foreign Application Priority Data

Dec. 19, 2011  (JP) .................. 2011-276733

(51) Int. Cl.
*G03F 7/20* (2006.01)
*H01J 37/302* (2006.01)

(52) U.S. Cl.
CPC ............ *G03F 7/0259* (2013.01); *G03F 7/2065* (2013.01); *H01J 37/302* (2013.01); *Y10S 430/143* (2013.01)
USPC .................. 430/298; 430/942; 250/396 R

(58) Field of Classification Search
CPC ..... G03F 7/2059; G03F 7/2065; H01J 37/302
USPC ................. 430/296, 942; 250/396 R, 492.2, 250/492.22, 492.23, 492.3
See application file for complete search history.

(56) References Cited

U.S. PATENT DOCUMENTS

| 6,249,306 B1 | 6/2001 | Isono et al. |
| 2005/0072941 A1 | 4/2005 | Tanimoto et al. |
| 2008/0237460 A1 | 10/2008 | Fragner et al. |
| 2010/0124722 A1 | 5/2010 | Fragner et al. |
| 2013/0056645 A1 | 3/2013 | Yoshikawa et al. |
| 2013/0056647 A1 | 3/2013 | Yoshikawa et al. |

FOREIGN PATENT DOCUMENTS

| JP | 2000-43317 | 2/2000 |
| JP | 2006-261342 | 9/2006 |
| JP | 2008-252095 | 10/2008 |
| JP | 4313145 | 5/2009 |
| JP | 2010-123966 | 6/2010 |
| JP | 2013-55144 A | 3/2013 |
| JP | 2013-55145 A | 3/2013 |

OTHER PUBLICATIONS

U.S. Appl. No. 13/763,976, filed Feb. 11, 2013, Touya, et al.
U.S. Appl. No. 13/770,322, filed Feb. 19, 2013, Matsumoto.
U.S. Appl. No. 13/597,699, filed Aug. 29, 2012, Ryoichi Yoshikawa, et al.
U.S. Appl. No. 13/597,772, filed Aug. 29, 2012, Ryoichi Yoshikawa, et al.

*Primary Examiner* — Christopher Young
(74) *Attorney, Agent, or Firm* — Oblon, Spivak, McClelland, Maier & Neustadt, L.L.P.

(57) ABSTRACT

A multi charged particle beam writing apparatus according to an embodiment, includes a setting unit to set a second region such that more openings in remaining openings except for an opening through which the defective beam passes are included in the second region, a selection unit to select a mode from a first mode in which a pattern is written on a target object by using multiple beams having passed openings in the second region and a second mode in which multiple writing is performed while shifting a position by using at least one of remaining multiple beams in the state where the defective beam is controlled to be beam off and additional writing is performed for a position which was supposed to be written by the defective beam, and a writing processing control unit to control to write in the mode selected.

4 Claims, 18 Drawing Sheets

Third Pass

Stage Movement

Second Pass

First Pass

MULTI CHARGED PARTICLE BEAM WRITING APPARATUS AND MULTI CHARGED PARTICLE BEAM WRITING METHOD

CROSS-REFERENCE TO RELATED APPLICATION

This application is based upon and claims the benefit of priority from the prior Japanese Patent Application No. 2011-276733 filed on Dec. 19, 2011 in Japan, the entire contents of which are incorporated herein by reference.

BACKGROUND OF THE INVENTION

1. Field of the Invention

The present invention relates to a multi charged particle beam writing apparatus and a multi charged particle beam writing method. For example, the present invention relates to a method of obtaining the high accuracy of multi-beam writing.

2. Description of Related Art

The lithography technique that advances microminiaturization of semiconductor devices is extremely important as being a unique process whereby patterns are formed in the semiconductor manufacturing. In recent years, with high integration of LSI, the line width (critical dimension) required for semiconductor device circuits is decreasing year by year. The electron beam (EB) writing technique, which intrinsically has excellent resolution, is used for writing or "drawing" a pattern on a wafer, etc. with electron beams.

As an example using the electron beam writing technique, there is a writing apparatus using multiple beams (multi-beams). Since it is possible for a multi-beam writing apparatus to perform irradiation with many beams at a time, throughput can be greatly increased compared with the case of writing using one electron beam. In such a writing apparatus of a multi-beam system, for example, multiple beams are formed by letting an electron beam emitted from the electron gun assembly pass through a mask with a plurality of holes arranged in a matrix, blanking control is performed for each beam, and each of unblocked beams is deflected by a deflector so as to irradiate a desired position on a target object or "sample" (refer to, e.g., Japanese Patent Application Laid-open (JP-A) No. 2006-261342).

In such a writing apparatus of the multi-beam system, irradiation of a plurality of beams is performed at a time, and a pattern is written by combining "beam on" and "beam off" by blanking control as described above. Regarding the writing apparatus of the multi-beam system, there is a concern about yield (generation of a defective beam) because of structural complexity for forming and controlling a plurality of beams. For example, a defective beam being continuously "beam off" may be generated when "beam on" control cannot be performed. In addition, there is a case where a defective beam is generated because it is impossible to obtain a specified amount of beam current even if "beam on" control can be performed or impossible to control a dose to have a desired accuracy because of poor responsiveness even when "beam on" control and "beam off" control are performed for a predetermined irradiation time. When a defective beam of this kind exists, a problem occurs in that a desired pattern is not written or desired writing accuracy is not obtained even when writing is performed.

For example, there is thought of a method of maintaining writing accuracy by redundancy, that is, preparing many more beams against generation of a defective beam in order to respond by using other beam instead of the defective beam. This method is, for example, that if a position on a target object is irradiated with one-hundred beams, even when one of the beams is defective, the dose will have 1% error at most. However, with recent miniaturization of patterns, approximately 0.1% of accuracy, for example, is required for the dose accuracy. Thus, for maintaining the accuracy of 0.1% by using the redundancy, theoretically, beams of 1000 times the number of beams to be used for writing are needed. As a result, in order to maintain the writing accuracy by using the redundancy, it is necessary to newly prepare hardware resource and software resource for a huge number of beams being 1000 times the number of beams used in the case of no redundancy, thereby requiring excessive structure for the apparatus. Therefore, it is desired to solve the problem of defective beams by a different method from the method of increasing the number of beams.

BRIEF SUMMARY OF THE INVENTION

In accordance with one aspect of the present invention, a multi charged particle beam writing apparatus includes a stage configured to mount a target object thereon and be capable of moving continuously, an emission unit configured to emit a charged particle beam, an aperture member, in which a plurality of openings are formed, configured to form multiple beams by letting a first region including a whole of the plurality of openings be irradiated by the charged particle beam and letting parts of the charged particle beam pass through a corresponding opening of the plurality of openings respectively, a plurality of blankers configured to respectively perform blanking deflection of a corresponding beam in multiple beams having passed through the plurality of openings of the aperture member, a blanking aperture member configured to block each of beams which were deflected to be in a beam off state by the plurality of blankers, a detection unit configured to detect a defective beam in the multiple beams having passed through the plurality of openings of the aperture member, a setting unit configured to set a second region such that more openings in remaining openings except for an opening through which the defective beam passes in the plurality of openings of the aperture member are included in the second region, a selection unit configured to select a mode from a first mode in which a pattern is written on a target object by using multiple beams that have passed openings in the second region and a second mode in which multiple writing is performed while shifting a position by using at least one of remaining multiple beams in a state where the defective beam is controlled to be beam off and additional writing is performed for a position which was supposed to be written by the defective beam, and a writing processing control unit configured to control writing processing to write in the mode selected.

In accordance with another aspect of the present invention, a multi charged particle beam writing apparatus includes a stage configured to mount a target object thereon and be capable of moving continuously, an emission unit configured to emit a charged particle beam, an aperture member in which a plurality of openings are formed, configured to form multiple beams by letting a region including a whole of the plurality of openings be irradiated by the charged particle beam and letting parts of the charged particle beam pass through a corresponding opening of the plurality of openings respectively, a plurality of blankers configured to respectively perform blanking deflection of a corresponding beam in multiple beams having passed through the plurality of openings of the aperture member, a blanking aperture member configured to block each of beams which were deflected to be in a beam off state by the plurality of blankers, a detection unit configured to detect a defective beam in the multiple beams having passed through the plurality of openings of the aperture member, and a writing processing control unit configured to control writing processing such that multiple writing is performed while shifting a position by using at least one of remaining multiple beams in a state where the defective beam is controlled to be beam off and additional writing is performed for a position which was supposed to be written by the defective beam.

Further, in accordance with another aspect of the present invention, a multi charged particle beam writing method includes detecting a defective beam in multiple beams having passed through a plurality of openings of an aperture member in which the plurality of openings are formed for forming the multiple beams by irradiation of a charged particle beam, setting a region such that more openings in remaining openings except for an opening through which the defective beam passes in the plurality of openings of the aperture member are included in the region, selecting a mode from a first mode in which a pattern is written on a target object by using multiple beams that have passed openings in the region and a second mode in which multiple writing is performed while shifting a position by using at least one of remaining multiple beams in a state where the defective beam is controlled to be beam off and additional writing is performed for a position which was supposed to be written by the defective beam, and writing a pattern on a target object in the mode selected.

DETAILED DESCRIPTION OF THE INVENTION

In the following Embodiments, there will be described a structure in which an electron beam is used as an example of a charged particle beam. The charged particle beam is not limited to the electron beam, and other charged particle beam, such as an ion beam, may also be used.

Moreover, in the following Embodiments, there will be described an apparatus and a method, in a multi-beam writing system, capable of writing efficiently while maintaining high accuracy even in generation of a defective beam which is continuously "beam off" because "beam on" control cannot be performed or which is not controlled to have desired dose accuracy even when beam control is performed for a predetermined irradiation time.

Embodiment 1

Figure 1:
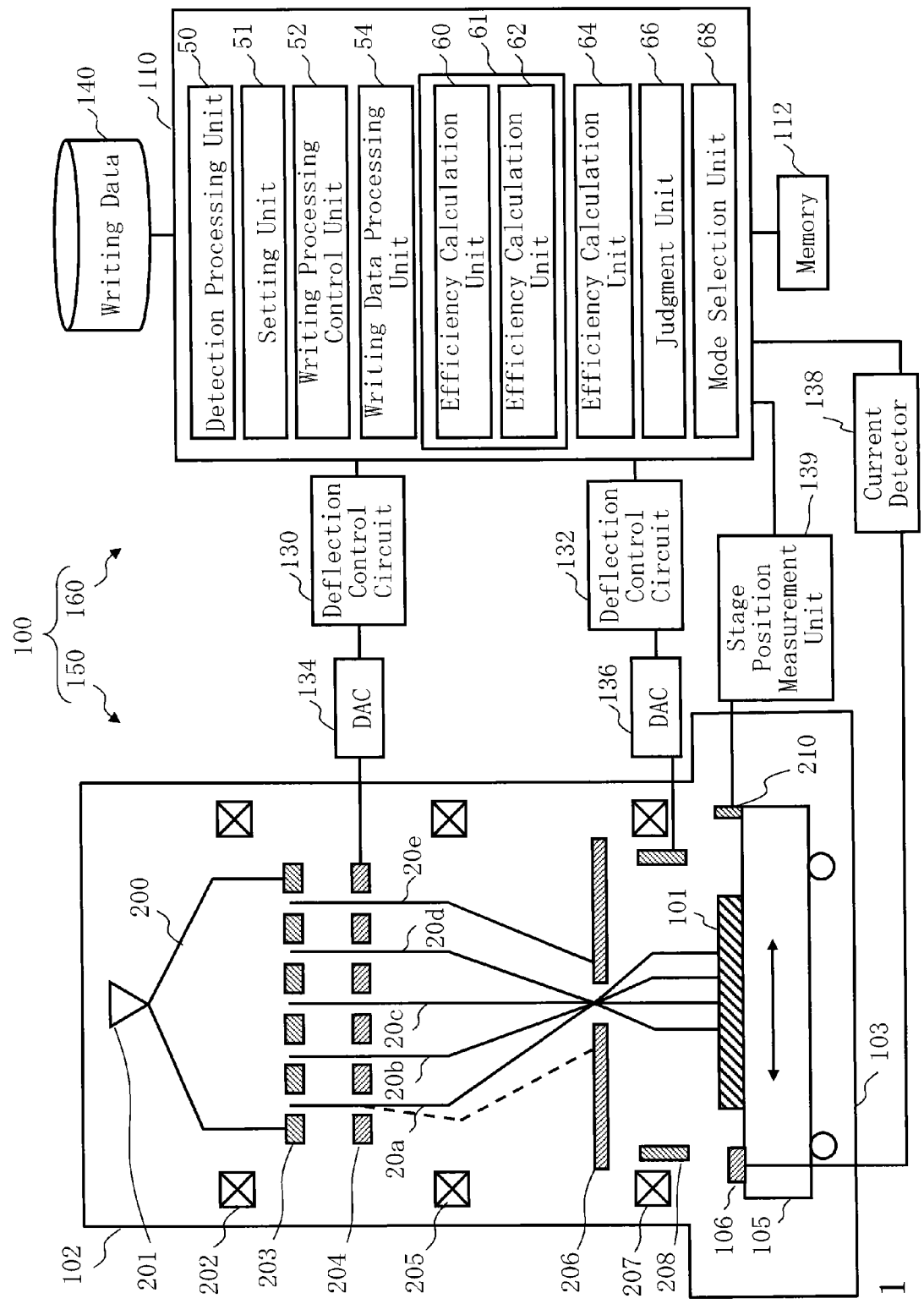
FIG. 1 is a schematic diagram showing a configuration of a writing apparatus according to Embodiment 1.

FIG. 1 is a schematic diagram showing a configuration of a writing apparatus according to Embodiment 1. In FIG. 1, a writing (or "drawing") apparatus 100 includes a writing unit 150 and a control unit 160. The writing apparatus 100 is an example of a multi charged particle beam writing apparatus. The writing unit 150 includes an electron lens barrel 102 and a writing chamber 103. In the electron lens barrel 102, there are arranged an electron gun assembly 201, an illumination lens 202, an aperture member 203, a blanking plate 204, a reducing lens 205, a limiting aperture member 206, an objective lens 207, and a deflector 208. In the writing chamber 103, there is arranged an XY stage 105, on which a target object or "sample" 101 such as a mask serving as a writing target substrate is placed. The target object 101 is, for example, an exposure mask used for manufacturing semiconductor devices, or a semiconductor substrate (silicon wafer) on which semiconductor elements are formed. The target object 101 may be, for example, a mask blank on which resist is applied and a pattern has not yet been formed. On the XY stage 105, further, there are arranged a Faraday cup 106 as an example of a current amount measurement unit, and a mirror 210 for measuring a position of the XY stage 105.

The controlling unit 160 includes a control computer 110, a memory 112, deflection control circuits 130 and 132, digital-to-analog converter (DAC) amplifiers 134 and 136, a current detector 138, a stage position measurement unit 139, and a storage device 140 such as a magnetic disk drive. The control computer 110, the memory 112, the deflection control circuits 130 and 132, the DAC amplifiers 134 and 136, the current detector 138, the stage position measurement unit 139, and the storage device 140 are mutually connected through a bus (not shown). Writing data is input into the storage device 140 (storage unit) from the outside to be stored therein.

In the control computer 110, there are arranged a detection processing unit 50, a setting unit 51, a writing processing control unit 52, a writing data processing unit 54, an efficiency calculation unit 61 (first efficiency calculation unit), an efficiency calculation unit 64 (second efficiency calculation unit), a judgment unit 66, and a mode selection unit 68. The efficiency calculation unit 61 includes a y direction division efficiency calculation unit 60 (third efficiency calculation unit) and an x direction division efficiency calculation unit 62 (fourth efficiency calculation unit). Each function, such as the detection processing unit 50, the setting unit 51, the writing processing control unit 52, the writing data processing unit 54, the efficiency calculation units 61 and 64, the judgment unit 66, and the mode selection unit 68 may be configured by hardware such as an electronic circuit, or by software such as a program executing these functions. Alternatively, it may be configured by a combination of software and hardware. The data input and output to/from the detection processing unit 50, the setting unit 51, the writing processing control unit 52, the writing data processing unit 54, the efficiency calculation units 61 and 64, the judgment unit 66, and the mode selection unit 68 and data being calculated are stored in the memory 112 each time.

Each function, such as the y direction division efficiency calculation unit 60 and the x direction division efficiency calculation unit 62 may be configured by hardware such as an electronic circuit, or by software such as a program executing these functions. Alternatively, it may be configured by a combination of software and hardware. The data input and output to/from the y direction division efficiency calculation unit 60 and the x direction division efficiency calculation unit 62 and data being calculated are stored in the memory 112 each time.

As described above, FIG. 1 shows a structure necessary for explaining Embodiment 1. Other structure elements generally necessary for the writing apparatus 100 may also be included.

Figure 2A:
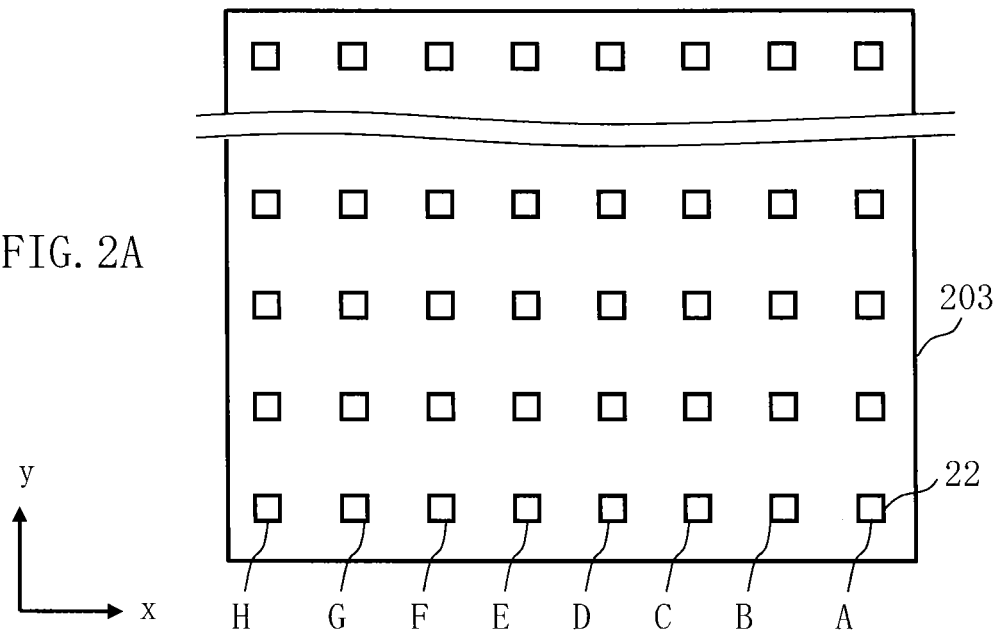
FIGS. 2A and 2B are schematic diagrams showing structures of an aperture member according to Embodiment 1.
Figure 2B:
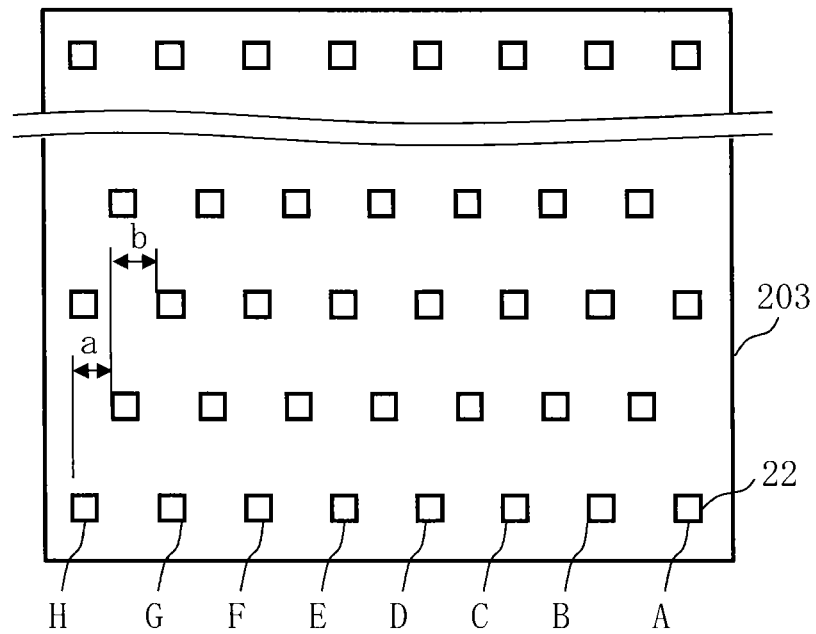

FIGS. 2A and 2B are schematic diagrams showing structures of an aperture member according to Embodiment 1. In FIG. 2A, holes (openings) 22 are formed in the shape of a matrix at a predetermined arrangement pitch in the aperture member 203, wherein m×n (m≥2, n≥2) holes 22 are in m columns in the vertical direction (the y direction) and in n rows in the horizontal direction (the x direction). In FIG. 2A, holes 22 of 512 (rows)×8 (columns) are formed, for example. Each hole 22 has the same dimensional shape of a quadrangle, such as a rectangle or a square. Alternatively, each hole may be a circle of the same circumference. In this case, there is shown an example of each row having eight holes 22 from A to H in the x direction. Multi-beams 20 are formed by letting parts of an electron beam 200 pass through a corresponding hole of a plurality of holes 22 respectively. Here, there is shown the case where the holes 22 are arranged in two or more columns and rows in both the x and the y directions, but it is not limited thereto. For example, it is also acceptable to arrange a plurality of holes 22 in only one row or in only one column, that is, in one row and a plurality of columns, or in one column and a plurality of rows. Moreover, the method of arranging the holes 22 is not limited to the case of FIG. 2A where holes are arranged in a grid. It is also preferable to arrange the holes 22 as shown in FIG. 2B where the position of each hole in the second row is shifted from the position of each hole in the first row by a dimension "a" in the horizontal direction (x direction). Similarly, it is also preferable to arrange the holes 22 such that the position of each hole in the third row is shifted from the position of each hole in the second row by a dimension "b" in the horizontal direction (x direction).

Figure 3:
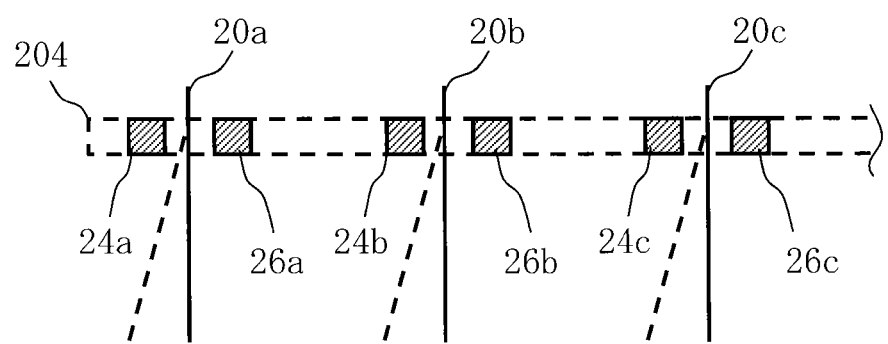
FIG. 3 is a schematic diagram showing a structure of a blanking plate according to Embodiment 1.

FIG. 3 is a schematic diagram showing a structure of the blanking plate according to Embodiment 1. In the blanking plate 204, a passage hole is formed to be corresponding to the arrangement position of each hole 22 of the aperture member 203, and a pair of electrodes (blankers) 24 and 26 is arranged for each passage hole. The electron beams 20 (multiple beams) respectively passing through a corresponding passage hole are respectively deflected by the voltage applied to two electrodes 24 and 26 being a pair, and blanking control is performed by this deflection. Thus, a plurality of blankers respectively perform blanking deflection of a corresponding beam in multiple beams having passed through a plurality of holes 22 (openings) of the aperture member 203.

The electron beam 200 emitted from the electron gun assembly 201 (emission unit) almost perpendicularly illuminates the whole of the aperture member 203 by the illumination lens 202. A plurality of holes (openings), each in the shape of a quadrangle, such as a rectangle or a square, are formed in the aperture member 203. The region including all the plurality of holes is irradiated by the electron beam 200. For example, a plurality of rectangular electron beams (multiple beams) 20a to 20e are formed by letting parts of the electron beam 200 irradiating the positions of a plurality of holes pass through a corresponding hole of the plurality of holes of the aperture member 203 respectively. The multiple beams 20a to 20e respectively pass through a corresponding blanker of the blanking plate 204. Each blanker deflects (performs blanking deflection) the electron beam 200 which passes respectively. The multiple beams 20a, 20b, 20c, . . . , having passed through the blanking plate 204 are reduced by the reducing lens 205, and go toward the hole at the center of the limiting aperture member 206. Here, the electron beam 20 which was deflected by the blanker of the blanking plate 204 deviates from the hole of the center of the limiting aperture member 206 (blanking aperture member) and is blocked by the limiting aperture member 206. On the other hand, the electron beam 20 which was not deflected by the blanker of the blanking plate 204 passes through the hole at the center of the limiting aperture member 206. Blanking control is performed by on/off of the blanker so as to control on/off of the beam. Thus, the limiting aperture member 206 blocks each beam which was deflected to be in the "beam off" state by a plurality of blankers. Then, one shot of the beam is formed by beams which have been formed during from the "beam on" state to the "beam off" state and have passed through the limiting aperture member 206. The multi-beams 20 having passed through the limiting aperture member 206 are focused by the objective lens 207 to become a pattern image of a desired reduction rate, and respective beams (the entire multi-beams 20) having passed through the limiting aperture member 206 are collectively deflected in the same direction by the deflector 208 so as to irradiate respective irradiation positions on the target object 101. While the XY stage 105 is continuously moving, controlling is performed by the deflector 208 so that irradiation positions of beams may follow the movement of the XY stage 105, for example. Ideally, multi-beams 20 to irradiate at a time are aligned at pitches obtained by multiplying the arrangement pitch of a plurality of holes of the aperture member 203 by a desired reduction rate described above. The writing apparatus 100 performs a writing operation by the raster scan method which continuously irradiates shot beams in order, and when writing a desired pattern, a required beam is controlled by blanking control to be "beam on" according to a pattern.

Figure 4A:
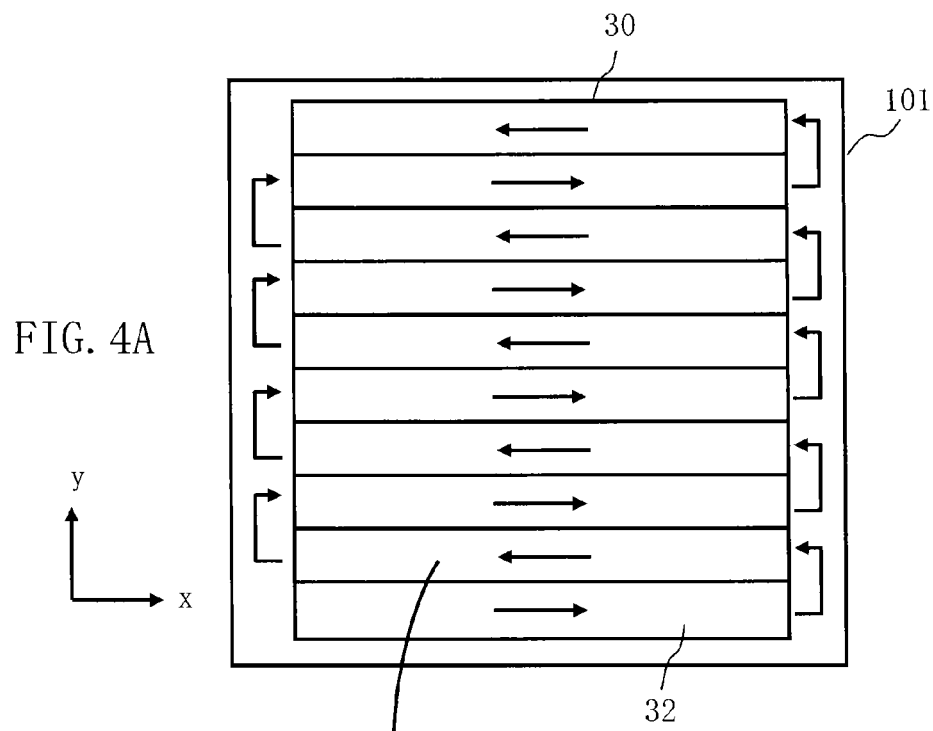
FIGS. 4A to 4C are schematic diagrams explaining a writing operation according to Embodiment 1.
Figure 4B:
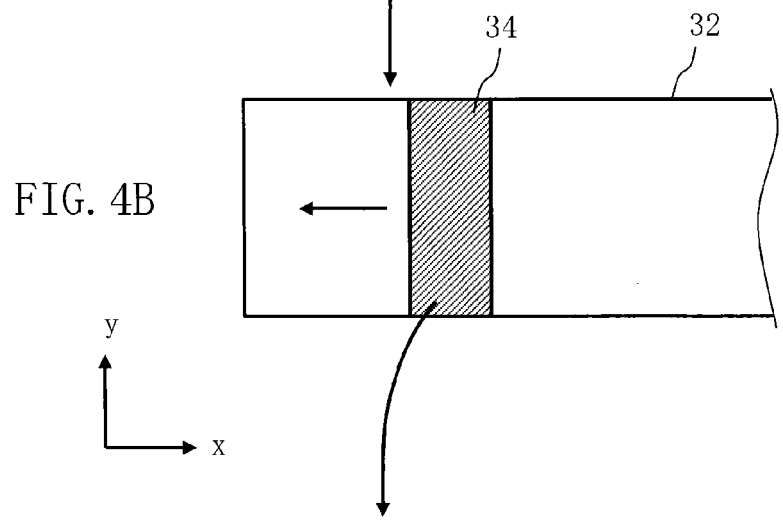
Figure 4C:
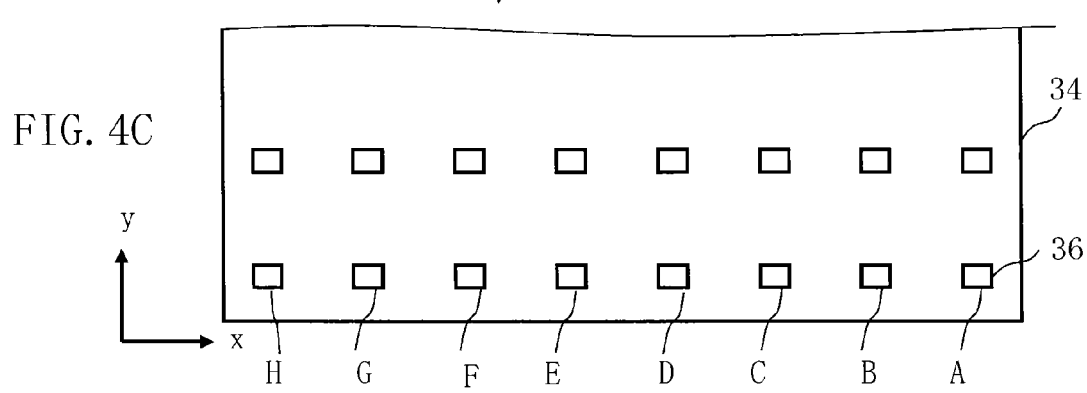

FIGS. 4A to 4C are schematic diagrams explaining a writing operation according to Embodiment 1. As shown in FIG. 4A, a writing region 30 of the target object 101 is virtually divided into a plurality of strip-shaped stripe regions 32 each having a predetermined width in the y direction, for example. Each of the stripe regions 32 serves as a writing unit region. First, the XY stage 105 is moved and adjusted such that an irradiation region 34 to be irradiated by one-time irradiation of the multi-beams 20 is located at the left end of the first stripe region 32 or at the further left position, and then writing is started. When writing the first stripe region 32, writing advances relatively in the x direction by moving the XY stage 105 in the −x direction, for example. The XY stage 105 is continuously moved at a predetermined rate, for example. After writing the first stripe region 32, the stage position is moved in the −y direction and adjusted such that the irradiation region 34 is located, to be relatively in the y direction, at the right end of the second stripe region 32 or at the further right position. Then, similarly, as shown in FIG. 4B, writing advances in the −x direction by moving the XY stage 105 in the x direction, for example. Writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also acceptable to perform writing in the same direction when writing each stripe region 32. By one shot, as shown in FIG. 4C, a plurality of shot patterns 36 of the same number as the holes 22 are formed at a time by multiple beams formed bypassing through respective corresponding holes 22 of the aperture member 203. For example, a beam which passed through one hole A of the aperture member 203 irradiates the position "A" shown in FIG. 4C and forms the shot pattern 36 at this position. Similarly, a beam which passed through one hole B of the aperture member 203 irradiates the position "B" shown in FIG. 4C and forms the shot pattern 36 at this position, for example. Hereafter, a similar operation is performed with respect to C to H. When writing each stripe 32 while the XY stage 105 is moving in the x direction, the writing operation is executed by a raster scan method in which the deflector 208 performs deflection such that each shot moves (scans) in the y direction or in the x and y directions in order and shot beams deliver radiation continuously in order.

Figure 5:
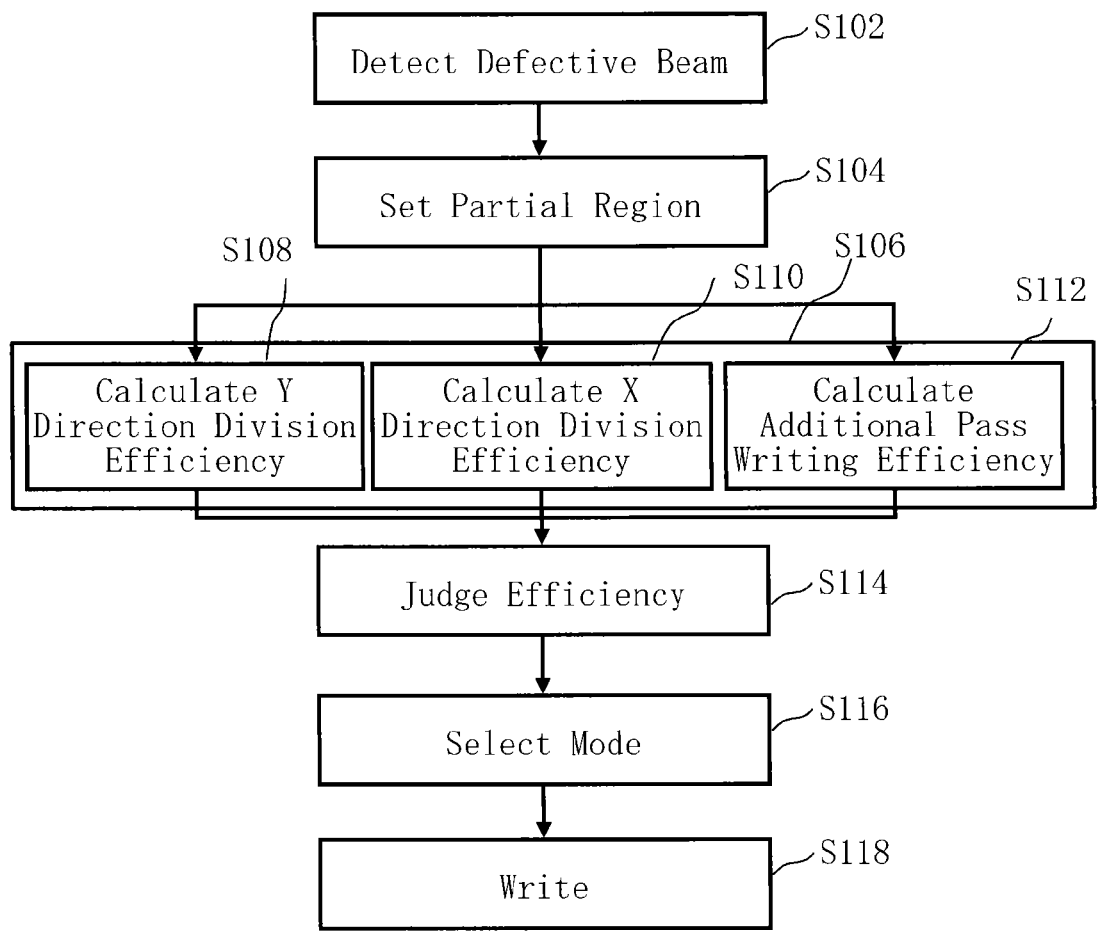
FIG. 5 is a flowchart showing main steps of a writing method according to Embodiment 1.

FIG. 5 is a flowchart showing main steps of a writing method according to Embodiment 1. In FIG. 5, the writing method according to Embodiment 1 executes a series of steps: a defective beam detection step (S102), a partial region (second region) setting step (S104), an efficiency calculation step (S106), an efficiency judging step (S114), a mode selection step (S116), and a writing step (S118). Moreover, the efficiency calculation step (S106) executes a series of steps as its internal steps: a y direction division efficiency calculation step (S108), an x direction division efficiency calculation step (S110), and an additional pass writing efficiency calculation step (S112).

In the defective beam detection step (S102), the detection processing unit 50 (detection unit) detects a defective beam in the multi-beams 20 having passed through a plurality of holes 22 (openings) of the aperture member 203 in which a plurality of holes 22 are formed for forming the multi-beams 20 by the irradiation of the electron beam 200. The detection method is, for example, to measure the amount of current of each beam of the multi-beams 20 by the detection processing unit 50. Specifically, the XY stage 105 is moved in order so that the Faraday cup 106 may be located at the position irradiated by each beam of the multi-beams 20. The Faraday cup 106 is irradiated by each of the multi-beams 20 one by one, and an analog signal is sent to the current detector 138 from the Faraday cup 106. The current detector 138 outputs a digital signal (data signal) indicating the amount of current of each beam irradiating the Faraday cup 106 to the detection processing unit 50. Thus, the detection processing unit 50 measures a current amount of each beam irradiating the Faraday cup 106. It is preferable that beams other than the object beam to be measured are made to be in the "beam off" state by blanking control. Even if beams other than the object beam irradiate the Faraday cup 106, it is acceptable for them to keep the "beam on" state as long as they have a positional relation not to be detected by the Faraday cup 106. If there is a beam whose current amount cannot be measured (namely, current is not detected), the beam is defective being continuously "beam off" because of not being controlled to be "beam on". Moreover, if there is a beam which does not have a desired amount of current even though the current amount is detected, the beam is defective because it is impossible to control its dose since the beam is not able to become off after a prescribed irradiation time period even if it can be in the "beam on" state. Thus, based on the data signal input from the current detector 138, the detection processing unit 50 detects a beam whose current amount cannot be measured (namely, current is not detected) or whose current amount is not a desired one, as a defective beam.

In the partial region (quadrangular region) setting step (S104), the setting unit 51 sets a partial region (quadrangular region) including m beams in the x direction and n beams in the y direction such that more holes 22 in the remaining holes 22, excluding the hole through which a defective beam passes, in a plurality of holes 22 of the aperture member 203 are included in the partial region. In other words, the partial region (quadrangular region) is set by dividing a plurality of holes 22 to be divided in the y direction (the first direction) or to be divided in the x direction (the second direction), wherein to be divided in the x or y direction means to be divided to be parallel to the plane where a plurality of holes 22 (openings) of the aperture member 203 are formed.

Figure 6:
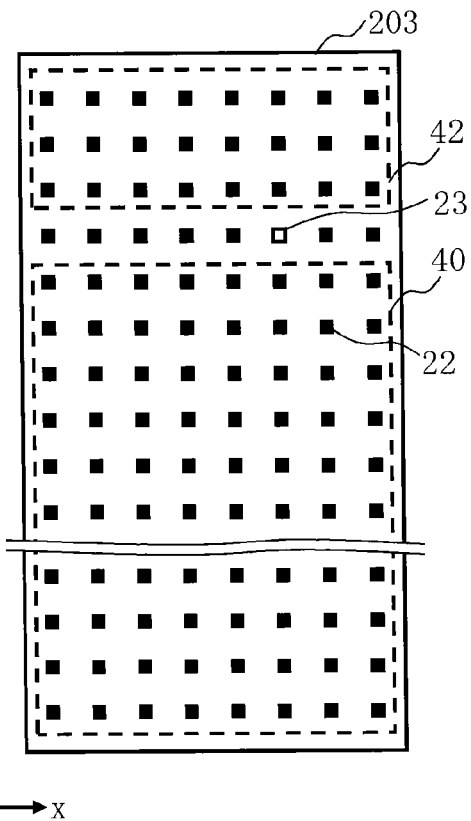
FIG. 6 shows an example of partial regions (quadrangular regions) based on the y direction division according to Embodiment 1.

FIG. 6 shows an example of partial regions (quadrangular regions) based on the y direction division, divided to be aligned in the y direction, where divided regions are located in the y direction, according to Embodiment 1. In FIG. 6, there is shown an example of the aperture member 203 in which holes are arranged in a matrix of five hundred and twelve holes 22 in the vertical direction (the y direction) and eight holes 22 in the horizontal direction (the x direction). In FIG. 6, for example, a hole 23 which is the sixth from the left end in the x direction and the fourth from the top in the −y direction is a defective beam in the holes 22. Then, when setting partial regions (quadrangular regions) to be divided to be aligned in the y direction while excluding the defective beam, two partial regions (quadrangular regions) 40 and 42 can be set as shown in FIG. 6: the partial region (quadrangular region) 40 including a plurality of holes 22 of all the columns aligned in the x direction and rows from the fifth row to the bottom row, counted from the top, aligned in the −y direction, and the partial region (quadrangular region) 42 including a plurality of holes 22 of all the columns aligned in the x direction and rows from the top to the third row aligned in the −y direction. In this case, since the beam arrangement goes straight in the x and y directions, each of the partial regions (quadrangular regions) where beams of m beams in the x direction and n beams in the y direction are included is a square or a rectangle. However, if the arrangement does not go straightly, the partial region is a shape depending upon the arrangement. Comparing the partial regions (quadrangular regions) 40 and 42, since there are more holes 22 in the partial region (quadrangular region) 40, the partial region (quadrangular region) 40 is selected in the case of the y direction division.

Figure 7:
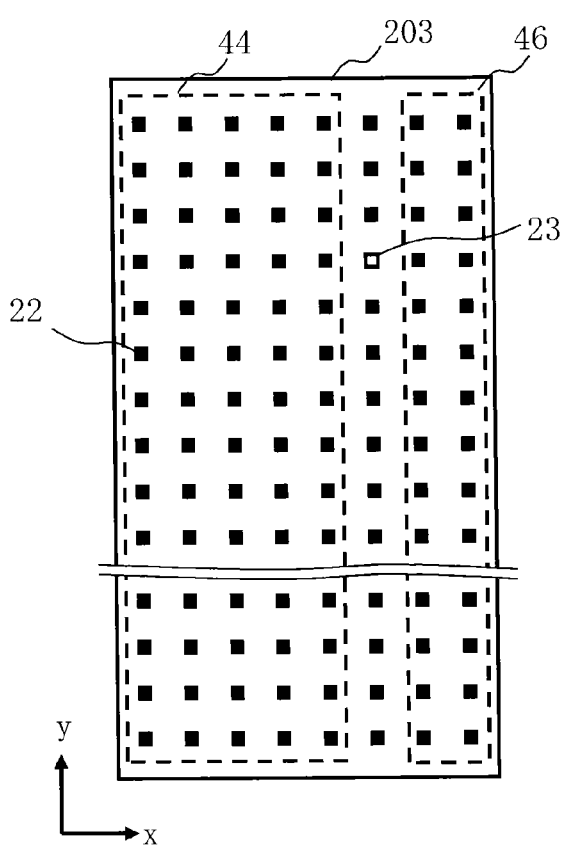
FIG. 7 shows an example of partial regions (quadrangular regions) based on the x direction division according to Embodiment 1.

FIG. 7 shows an example of partial regions (quadrangular regions) based on the x direction division, divided to be aligned in the x direction, where divided regions are located in the x direction, according to Embodiment 1. In FIG. 7, similarly to FIG. 6, there is shown an example of the aperture member 203 in which holes are arranged in a matrix of five hundred and twelve holes 22 in the vertical direction (the y direction) and eight holes 22 in the horizontal direction (the x direction). In FIG. 7 similarly to FIG. 6, for example, the hole 23 which is the sixth from the left end in the x direction and the fourth from the top in the −y direction is a defective beam in the holes 22. Then, when setting partial regions (quadrangular regions) to be divided to be aligned in the x direction while excluding the defective beam, two partial regions (quadrangular regions) 44 and 46 can be set as shown in FIG. 7: the partial region (quadrangular region) 44 including a plurality of holes 22 of all the rows aligned in the y direction and columns from the left end to the fifth column aligned in the x direction, and the partial region (quadrangular region) 46 including a plurality of holes 22 of all the rows aligned in the y direction and columns from the seventh column to the right end, counted from the left end, aligned in the x direction. Comparing the partial regions (quadrangular regions) 44 and 46, since there are more holes 22 in the partial region (quadrangular region) 44, the partial region (quadrangular region) 44 is selected in the case of the x direction division.

According to Embodiment 1, the writing processing is performed by selecting the more efficient writing mode from the two modes of a writing mode (1) and a writing mode (2). The writing mode (1) (an example of the first mode) is a mode in which writing is performed by using multiple beams in the partial region (quadrangular region) which is set based on the y direction division or the x direction division described above. The writing mode (2) (an example of the second mode) is a mode in which writing is performed, in the state where the defective beam is controlled to be off, by using at least one of the remaining multiple beams, in executing multiple writing while shifting the position and further executing an additional pass writing with respect to a position which was supposed to be written by the defective beam. The writing mode (1) is divided into two modes of a writing mode (1-1) and a writing mode (1-2). The writing mode (1-1) (an example of the third mode) is a mode in which writing is performed by using multiple beams in the partial region (quadrangular region) set based on the y direction division described above. The writing mode (1-2) (an example of the fourth mode) is a mode in which writing is performed by using multiple beams in the partial region (quadrangular region) set based on the x direction division. In order to select the most efficient writing mode, the efficiency in each writing mode is calculated first.

In the efficiency calculation step (S106), each efficiency in performing writing in each writing mode is calculated.

In the y direction division efficiency calculation step (S108), the y direction division efficiency calculation unit 60 calculates the efficiency of the writing speed in the case of performing writing in the writing mode (1-1) based on the y direction division. The writing speed is proportional to the number of usable beams in the y direction. Therefore, for example, when performing writing by using 80% of the number of beams, compared with 100% of the number of beams with no defective beam, the efficiency of the writing speed decreases to 80%. The efficiency of the writing speed in the writing mode (1-1) is calculated by dividing the number of beams passing through a plurality of holes 22 in the y direction included in the partial region (quadrangular region) 40 by the number of beams passing through all the holes 22 in the y direction including the hole 23 of the defective beam of the aperture member 203. In other words, the efficiency of writing speed is a value obtained by dividing the number of beams in the y direction included in the partial region (quadrangular region) 40 by all the number of beams in the y direction having no defective beam. In the example of FIG. 6, all the number of beams in the y direction in the case of there being no defective beams is five hundred and twelve, and the number of beams in the y direction included in the partial region (quadrangular region) 40 is five hundred and eight. Therefore, the writing speed efficiency=$508/512$=0.992, and thus the efficiency of writing speed is 99.2%.

In the x direction division efficiency calculation step (S110), the x direction division efficiency calculation unit 62 calculates the efficiency of the writing speed in the writing mode (1-2) based on the x direction division. The writing speed is proportional to the number of usable beams in the x direction. Therefore, for example, when performing writing by using 80% of the number of beams, compared with 100% of the number of beams with no defective beam, the efficiency of the writing speed decreases to 80%. The efficiency of writing speed in the writing mode (1-2) is calculated by dividing the number of beams passing through a plurality of holes 22 in the x direction included in the partial region (quadrangular region) 44 by the number of beams passing through all the holes 22 in the x direction including the hole 23 of the defective beam of the aperture member 203. In other words, the efficiency of writing speed is a value obtained by dividing the number of beams in the x direction included in the partial region (quadrangular region) 44 by all the number of beams in the x direction having no defective beam. In the example of FIG. 7, all the number of beams in the x direction in the case of there being no defective beams is eight, and the number of beams in the x direction included in the partial region (quadrangular region) 44 is five. Therefore, the writing speed efficiency=$5/8$=0.625, and thus the efficiency of writing speed is 62.5%.

In the additional pass writing efficiency calculation step (S112), the efficiency calculation unit 64 calculates the efficiency of writing speed in the writing mode (2) which performs additional pass writing. For example, when performing writing by the multiplicity N=2 (the number of times of writing being twice), since it means to add one time of additional pass writing, the efficiency of writing speed is $2/3$=0.667, and thus, the efficiency of the writing speed decreases to 66.7%. The efficiency of writing speed is obtained by dividing the original multiplicity by a value of (the original multiplicity+1). For example, when performing writing by the multiplicity N=4 (the number of times of writing being four), the efficiency of writing speed is $4/5$=0.8, and thus, the efficiency of writing speed decreases to 80.0%. Here, as an example, it is assumed that writing is performed by the multiplicity N=2 (the number of times of writing being two).

In the efficiency judging step (S114), the judgment unit 66 judges the most efficient mode, based on the calculated efficiency of each writing mode. In the examples described above, it turns out that the efficiency of the writing speed in the case of performing writing in the writing mode (1-1) based on the y direction division is the best because of being 99.2%.

In addition, for example, when a defective beam exists at the position of 50% in the y direction and at the position of 50% in the x direction, the efficiency of the writing speed in the writing mode (1-1) falls to 50%. Similarly, the efficiency of the writing speed in the case of performing writing in the writing mode (1-2) also falls to 50%. On the other hand, when performing writing by the multiplicity N=2 (the number of times of writing being twice), the efficiency of the writing speed in the writing mode (2) is still 66.7%. Therefore, in such a case, the efficiency of the writing speed in the writing mode (2) is the best one. Thus, the efficiency of writing speed varies depending upon the position of a defective beam. Moreover, the efficiency of writing speed also varies depending upon the multiplicity. According to Embodiment 1, the most efficient mode is selected from the efficiencies of respective writing modes, and the writing processing control unit 52 controls the operation of each configuration element to perform writing processing in the selected mode.

In the mode selection step (S116), the mode selection unit 68 selects the most efficient mode from the efficiencies of respective writing modes. Here, the most efficient mode is selected from the efficiencies of the writing modes (1-1), (1-2), and (2).

Figure 8:
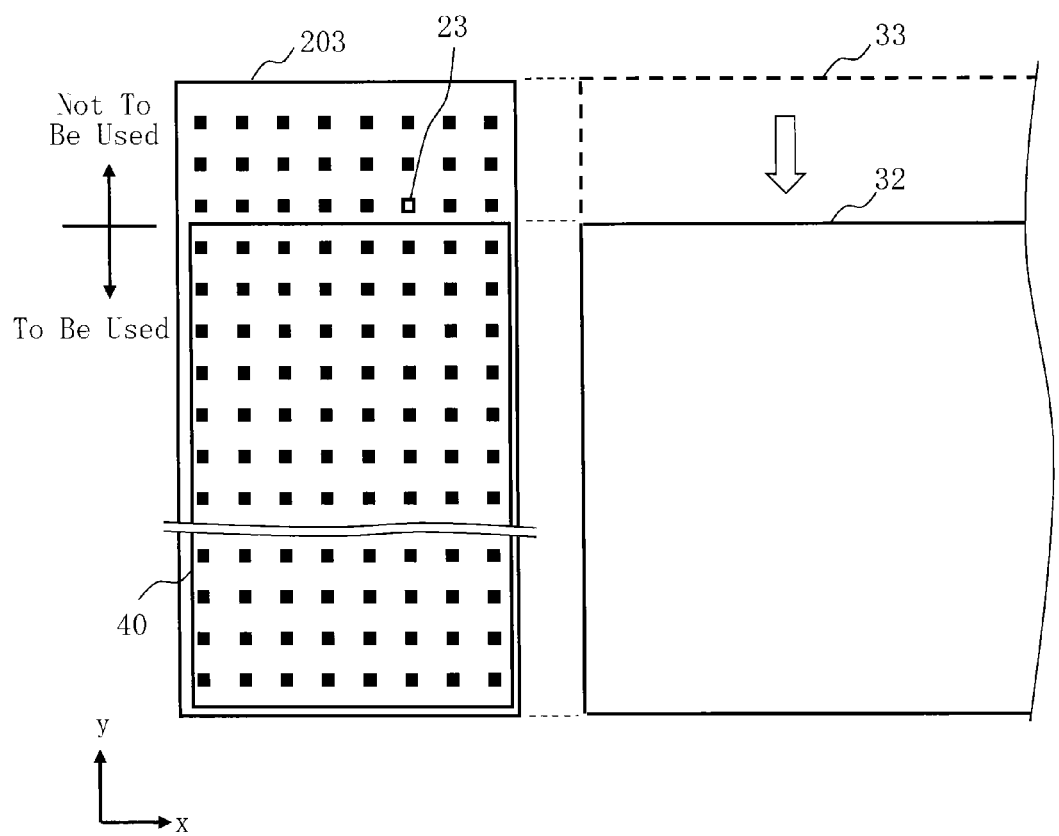
FIG. 8 is a schematic diagram explaining writing processing in a writing mode based on the y direction division according to Embodiment 1.

In the writing step (S118), the writing processing control unit 52 controls the operation of each configuration element to perform writing processing in the selected mode. For example, when the writing mode (1-1) is selected, the writing processing control unit 52 controls writing processing to write a pattern on the target object 101 by using the multiple beams formed by having passed through the holes 22 in the partial region (quadrangular region) 40. Specifically, writing processing is performed as follows:

FIG. 8 is a schematic diagram explaining writing processing in the writing mode based on the y direction division according to Embodiment 1. In the case of performing writing processing in the writing mode (1-1) based on the y direction division, when virtually dividing the writing region of the target object 101 into a plurality of stripe regions, the partial region (quadrangular region) 40 is divided by the width in the y direction. Specifically, the stripe width of the stripe region 33 in which all the multiple beams can be used because of there being no defective beam is reduced (to be small) to be the stripe region 32 which can be written in the partial region (quadrangular region) 40 restricted in the y direction. Then, the writing data processing unit 54 controlled by the writing processing control unit 52, for each stripe region 32, reads writing data from the storage device 140, performs data conversion processing of a plurality of steps, and generates shot data unique to the apparatus. The deflection control circuit 130 generates a signal for blanking control of a shot performed by each blanker each time, based on the shot data, and after amplifying with the DAC amplifier 134 and changing the digital signal to an analog signal, outputs it to each blanker. The deflection control circuit 130 controls corresponding blankers so that multiple beams passing through the holes 22 and 23, which are out of the partial region (quadrangular region) 40, in a plurality of holes 22 of the aperture member 203 may be in the "beam off" state. The deflection control circuit 130 is an example of a blanker control unit. Thus, in writing processing, it is preferable to make beams passing through a plurality of holes 22 and 23, which are out of the partial region (quadrangular region) 40, be in the "beam off" state by blanking control. When performing writing with beams having passed through the partial region 40, although beams out of the partial region 40 can be used together, if the beams out of the partial region 40 are made to be off, it becomes unnecessary to generate writing data for controlling the beams out of the partial region 40, thereby efficiently using the resource.

The deflection control circuit 132 calculates an amount of deflection in the x and y directions of each shot, generates a signal for deflection, and after amplifying the signal by the DAC amplifier 136 and converting the digital signal to an analog signal, outputs it to the deflector 208.

The writing unit 150 writes a pattern in each stripe region 32 on the target object 101 by using multiple beams formed by having passed through the holes 22 in the partial region (quadrangular region) 40.

Figure 9:
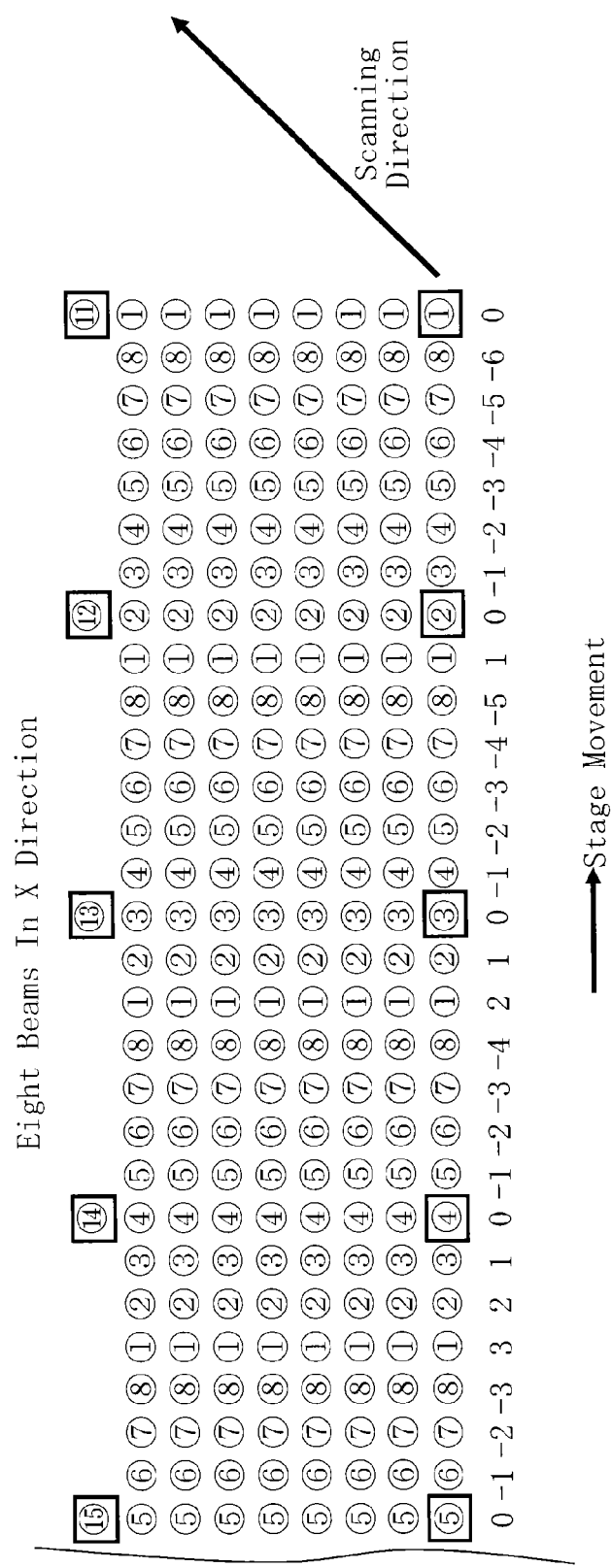
FIG. 9 is a schematic diagram explaining an example of a writing operation of raster scanning in a writing mode based on the y direction division according to Embodiment 1.

FIG. 9 is a schematic diagram explaining an example of a writing operation of raster scanning in a writing mode based on the y direction division according to Embodiment 1. In FIG. 9, for example, in the case of there being eight holes A to H formed in the x direction in the aperture member 203 as shown in FIG. 4C, irradiation is performed by beams of a plurality of shot times while the stage moves between the shot patterns 36 located side by side in the x direction and irradiated at a time. For example, it is set such that a region surrounded by four shot patterns 36 irradiated at a time is divided into control grids (AUs: Address Units) each of which has a predetermined quantization size and which are arranged in a grid shape, to be nAU×mAU. Specifically, the region surrounded by four shot patterns 36 irradiated at a time is composed of a certain shot pattern 36, another shot pattern 36 adjacent to the certain shot pattern 36 in the x direction and irradiated at a time, another shot pattern 36 adjacent to the certain shot pattern 36 in the y direction and irradiated at a time, and another shot pattern 36 which is adjacent in the y direction to the shot pattern 36 being adjacent to the certain shot pattern 36 in the x direction and which is irradiated at a time with the shot pattern 36 being adjacent to the certain shot pattern 36 in the x direction. Every time when shifted by AU, multiple beams are shot. FIG. 9 shows an example of being divided to be seven AUs in the x direction and eight AUs in the y direction.

In FIG. 9, controlling is performed such that the stage is moved in the +x direction and scanning is performed by deflecting the whole of the beams, by the deflector 208, in the same x direction and the y direction orthogonal to the x direction. This state is conceptually shown by an arrow at the right side of FIG. 9. The timing of starting scanning is denoted by T=−6 to T=3 on the basis of T=0 at the position below the opening hole position (square hole) of the aperture. FIG. 9 shows a typical writing position of each beam when each beam starts scanning at the timing of T=0. In this example, by performing scanning while deflecting beams in the x and y directions in accordance with the stage movement in the +x direction, the whole surface is to be filled with beam shots while the beam shots are relatively moving in the y direction. When the 0-th time scanning in the y direction (that is, the irradiation of eight AUs (eight shots) in the y direction) at the timing of T=0 is finished, the beam position is at the place shifted by one AU (in the −x direction) from the position where the adjacent beam started scanning when the 0-th time scanning in the y direction was started (that is, the place shifted by eight AUs from the position where the 0-th time scanning in the y direction started), and then, the first time (T=1) scanning is started from this position. The stage movement speed is controlled such that the beam position is at the place shifted by one AU in the −x direction (shifted by eight AUs) from the position of the adjacent beam, when one time y-scanning has finished. Writing is similarly executed with respect to the beams arranged upper and lower in the y direction, and beam shots are performed such that the whole surface is to be filled by the unit of AU. Various patterns can be written by performing blanking control for each of these shots to be "beam on" or "beam off" to be in accordance with a desired pattern.

Owing to this configuration, in the writing mode (1-1) based on the y direction division, although the writing speed is lower than the case of there being no defective beam, writing processing can be performed without reducing the writing accuracy. Consequently, when the writing mode (1-1) is selected, writing processing can be performed with better efficiency of writing speed than that of in the case using other mode.

Next, for example, when the writing mode (1-2) is selected, the writing processing control unit 52 controls writing processing to write a pattern on the target object 101 by using multiple beams formed by having passed through the holes 22 in the partial region (quadrangular region) 44. Specifically, writing processing is performed as follows: When there is no defective beam, writing is to be performed by using eight beams in the x direction and its operation may be the same as that of the case referring to FIG. 9, for example.

Figure 10:
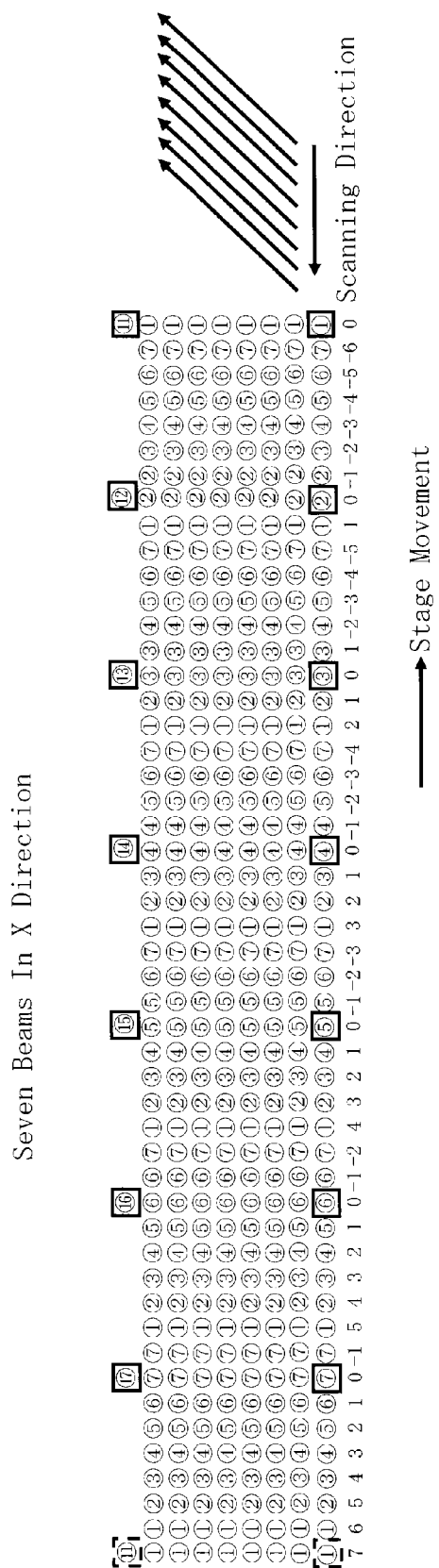
FIG. 10 is a schematic diagram explaining an example of a writing operation of raster scanning in a writing mode based on the x direction division according to Embodiment 1.

FIG. 10 is a schematic diagram explaining an example of a writing operation of raster scanning in a writing mode based on the x direction division according to Embodiment 1. FIG. 10 shows the case where the beam at the end of eight beams in the x direction is a defective beam, for example. In such a case, the number of beams in the x direction in the partial region (quadrangular region) 44 is seven. Similarly to FIG. 9, a region surrounded by four shot patterns 36 which are irradiated at a time is divided, for example, to be seven AUs in the x direction and eight AUs in the y direction. Specifically, similarly to FIG. 9, the region surrounded by four shot patterns 36 irradiated at a time is composed of a certain shot pattern 36, another shot pattern 36 adjacent to the certain shot pattern 36 in the x direction and irradiated at a time, another shot pattern 36 adjacent to the certain shot pattern 36 in the y direction and irradiated at a time, and another shot pattern 36 which is adjacent in the y direction to the shot pattern 36 being adjacent to the certain shot pattern 36 in the x direction and which is irradiated at a time with the shot pattern 36 being adjacent to the certain shot pattern 36 in the x direction.

In FIG. 10, it is controlled to move the stage in the +x direction and to scan the whole of the beams in the same x direction and the y direction orthogonal to the x direction. This state is conceptually shown by an arrow at the right side of FIG. 10. The timing of starting scanning is denoted by T=−6 to T=7 on the basis of T=0 at the position below the opening hole position (square hole) of the aperture. FIG. 10 shows a typical writing position of each beam when each beam starts scanning at the timing of T=0. In this example, by performing scanning in the x and y directions in accordance with the stage movement in the +x direction, the whole surface is to be filled with beam shots while the beam shots are relatively moving in the y direction. When the 0-th time scanning in the y direction at the timing of T=0 is finished, the beam position is at the adjacent beam position in the irradiation case at a time, and this position has already been irradiated by the adjacent beam in the irradiation case at a time. Thus, at this time, scanning is performed by deflection by the deflector 208 to be shifted by one AU (in the −x direction) from this position. Then, the first time (T=1) scanning is started from here. The stage movement speed is controlled such that when one time y scanning is finished, the beam position is at the adjacent beam position in the irradiation case at a time. Writing is similarly executed with respect to the beams upper and lower in the y direction, and beam shots are performed such that the whole surface is to be filled by the unit of AU. Various patterns can be written by performing blanking control for each of these shots to be "beam on" or "beam off" to be in accordance with a desired pattern.

Figure 11:
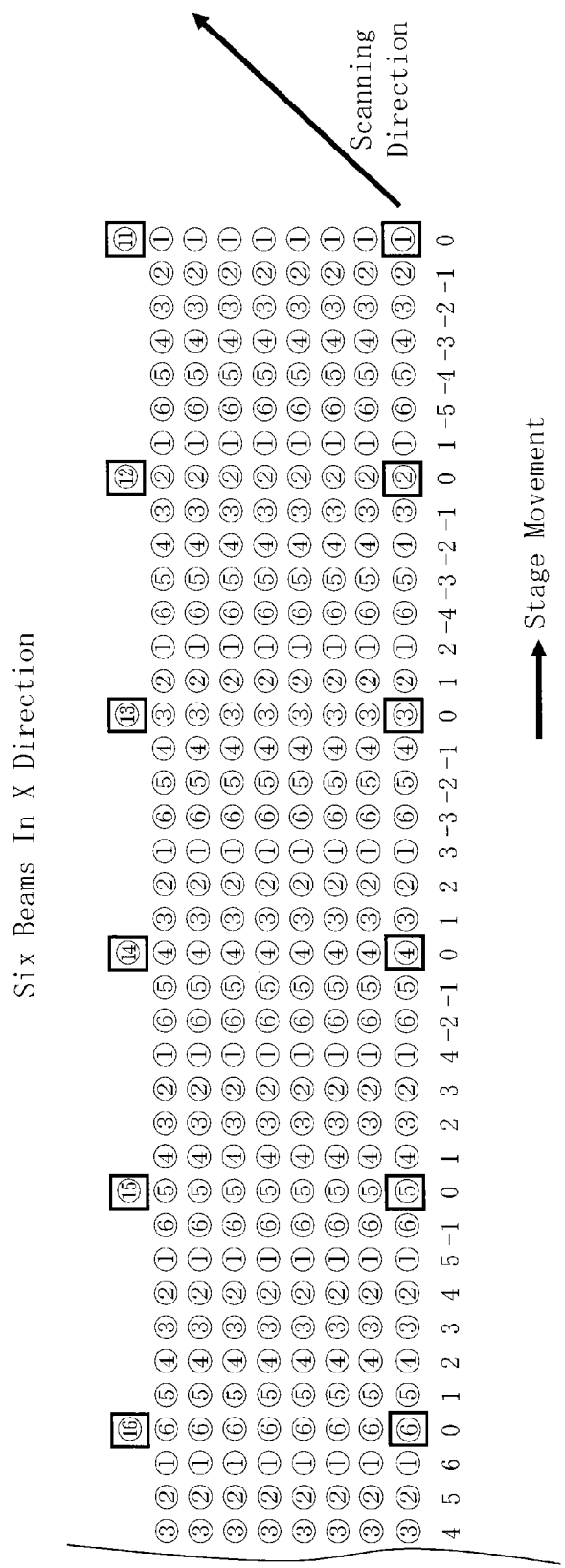
FIG. 11 is a schematic diagram explaining another example of a writing operation of raster scanning in a writing mode based on the x direction division according to Embodiment 1.

FIG. 11 is a schematic diagram explaining another example of a writing operation of raster scanning in a writing mode based on the x direction division according to Embodiment 1. FIG. 11 shows the case where the beam being the second inward from the end of eight beams in the x direction is a defective beam, for example. In such a case, the number of beams in the x direction in the partial region (quadrangular region) 44 is six. Similarly to FIG. 9, a region surrounded by four shot patterns 36 which are irradiated at a time is divided, for example, to be seven AUs in the x direction and eight AUs in the y direction. Specifically, similarly to FIG. 9, the region surrounded by four shot patterns 36 irradiated at a time is composed of a certain shot pattern 36, another shot pattern 36 adjacent to the certain shot pattern 36 in the x direction and irradiated at a time, another shot pattern 36 adjacent to the certain shot pattern 36 in the y direction and irradiated at a time, and another shot pattern 36 which is adjacent in the y direction to the shot pattern 36 being adjacent to the certain shot pattern 36 in the x direction and which is irradiated at a time with the shot pattern 36 being adjacent to the certain shot pattern 36 in the x direction.

In FIG. 11, it is controlled to move the stage in the +x direction and to scan the whole of the beams in the same x direction and the y direction orthogonal to the x direction. This state is conceptually shown by an arrow at the right side of FIG. 11. The timing of starting scanning is denoted by T=−5 to T=6 on the basis of T=0 at the position below the opening hole position (square hole) of the aperture. FIG. 11 shows a typical writing position of each beam when each beam starts scanning at the timing of T=0. In this example, by performing scanning in the x and y directions in accordance with the stage movement in the +x direction, the whole surface is to be filled with beam shots while the beam shots are relatively moving in the y direction. When the 0-th time scanning in the y direction at the timing of T=0 is finished, the beam position is at the place shifted by one AU (in the +x direction) from the position of the adjacent beam in the irradiation case at a time. Then, the first time (T=1) scanning is started from this position. The stage movement speed is controlled such that when one time y scanning is finished, the beam position is at the place shifted by one AU (in the +x direction) from the position of the adjacent beam in the irradiation case at a time. Writing is similarly executed with respect to the beams upper and lower in the y direction, and beam shots are performed such that the whole surface is to be filled by the unit of AU. Various patterns can be written by performing blanking control for each of these shots to be "beam on" or "beam off" to be in accordance with a desired pattern.

Figure 12:
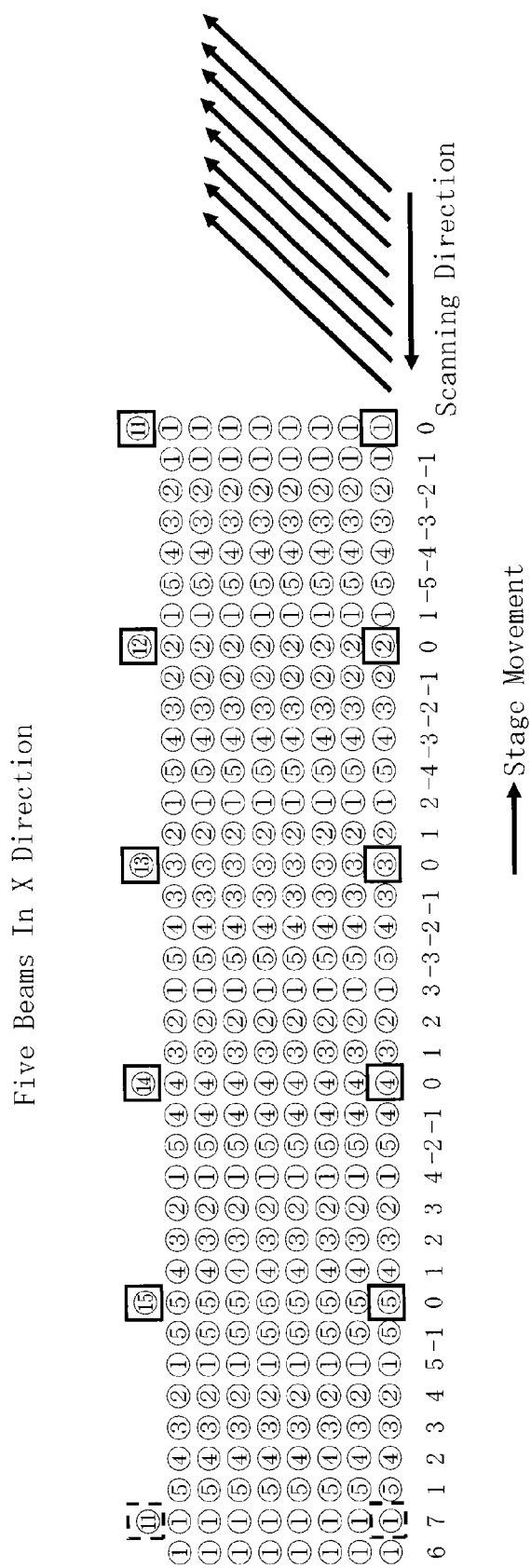
FIG. 12 is a schematic diagram explaining another example of a writing operation of raster scanning in a writing mode based on the x direction division according to Embodiment 1.

FIG. 12 is a schematic diagram explaining another example of a writing operation of raster scanning in a writing mode based on the x direction division according to Embodiment 1. FIG. 12 shows the case where the beam being the third inward from the end of eight beams in the x direction is a defective beam, for example. In such a case, the number of beams in the x direction in the partial region (quadrangular region) 44 is five. Similarly to FIG. 9, a region surrounded by four shot patterns 36 which are irradiated at a time is divided, for example, to be seven AUs in the x direction and eight AUs in the y direction. Specifically, similarly to FIG. 9, the region surrounded by four shot patterns 36 irradiated at a time is composed of a certain shot pattern 36, another shot pattern 36 adjacent to the certain shot pattern 36 in the x direction and irradiated at a time, another shot pattern 36 adjacent to the certain shot pattern 36 in the y direction and irradiated at a time, and another shot pattern 36 which is adjacent in the y direction to the shot pattern 36 being adjacent to the certain shot pattern 36 in the x direction and which is irradiated at a time with the shot pattern 36 being adjacent to the certain shot pattern 36 in the x direction.

In FIG. 12, it is controlled to move the stage in the +x direction and to scan the whole of the beams in the same x direction and the y direction orthogonal to the x direction. This state is conceptually shown by an arrow at the right side of FIG. 12. The timing of starting scanning is denoted by T=−5 to T=5 on the basis of T=0 at the position below the opening hole position (square hole) of the aperture. FIG. 12 shows a typical writing position of each beam when each beam starts scanning at the timing of T=0. In this example, by performing scanning in the x and y directions in accordance with the stage movement in the +x direction, the whole surface is to be filled with beam shots while the beam shots are relatively moving in the y direction. When the 0-th time scanning in the y direction at the timing of T=0 is finished, the beam position is at the place shifted by two AUs (in the +x direction) from the position of the adjacent beam in the irradiation case at a time and this position has already been irradiated by other beam. Thus, at this time, scanning is performed by deflection by the deflector 208 to be shifted by one AU (in the −x direction). Then, the first (T=1) scanning is started from this position. The stage movement speed is controlled such that when one time y scanning is finished, the beam position is at the place shifted by two AUs (in the +x direction) from the position of the adjacent beam in the irradiation case at a time. Writing is similarly executed with respect to the beams upper and lower in the y direction, and beam shots are performed such that the whole surface is to be filled by the unit of AU. Various patterns can be written by performing blanking control for each of these shots to be "beam on" or "beam off" to be in accordance with a desired pattern.

Figure 13:
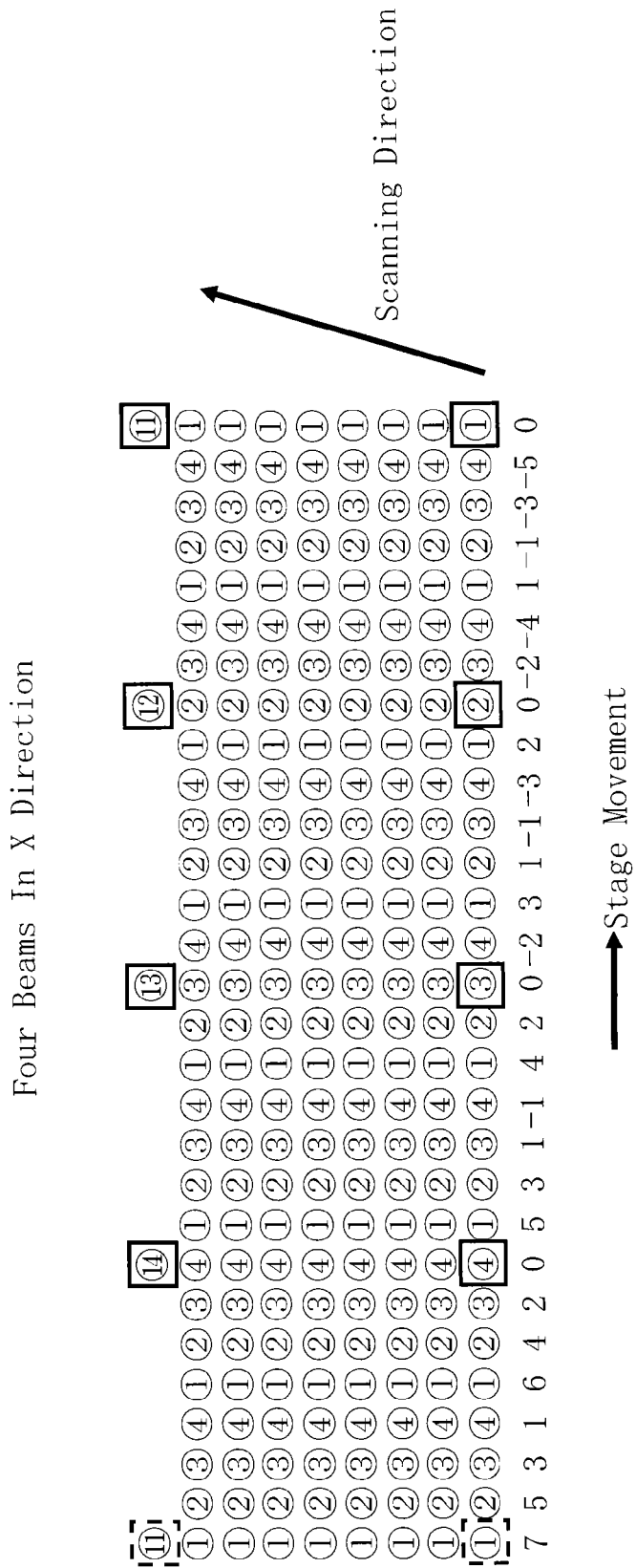
FIG. 13 is a schematic diagram explaining another example of a writing operation of raster scanning in a writing mode based on the x direction division according to Embodiment 1.

FIG. 13 is a schematic diagram explaining another example of a writing operation of raster scanning in a writing mode based on the x direction division according to Embodiment 1. FIG. 13 shows the case where the beam being the fourth inward from the end of eight beams in the x direction is a defective beam, for example. In such a case, the number of beams in the x direction in the partial region (quadrangular region) 44 is four. Similarly to FIG. 9, a region surrounded by four shot patterns 36 which are irradiated at a time is divided, for example, to be seven AUs in the x direction and eight AUs in the y direction. Specifically, similarly to FIG. 9, the region surrounded by four shot patterns 36 irradiated at a time is composed of a certain shot pattern 36, another shot pattern 36 adjacent to the certain shot pattern 36 in the x direction and irradiated at a time, another shot pattern 36 adjacent to the certain shot pattern 36 in the y direction and irradiated at a time, and another shot pattern 36 which is adjacent in the y direction to the shot pattern 36 being adjacent to the certain shot pattern 36 in the x direction and which is irradiated at a time with the shot pattern 36 being adjacent to the certain shot pattern 36 in the x direction.

In FIG. 13, it is controlled to move the stage in the +x direction and to scan the whole of the beams in the same x direction and the y direction orthogonal to the x direction. This state is conceptually shown by an arrow at the right side of FIG. 13. The timing of starting scanning is denoted by T=−5 to T=7 on the basis of T=0 at the position below the opening hole position (square hole) of the aperture. FIG. 13 shows a typical writing position of each beam when each beam starts scanning at the timing of T=0. In this example, by performing scanning in the x and y directions in accordance with the stage movement in the +x direction, the whole surface is to be filled with beam shots while the beam shots are relatively moving in the y direction. When the 0-th time scanning in the y direction at the timing of T=0 is finished, the beam position is at the place shifted by three AUs (in the +x direction) from the position of the adjacent beam in the irradiation case at a time. Then, the first time (T=1) scanning is started from this position. The stage movement speed is controlled such that when one time y scanning is finished, the beam position is at the place shifted by three AUs (in the +x direction) from the position of the adjacent beam in the irradiation case at a time. Writing is similarly executed with respect to the beams upper and lower in the y direction, and beam shots are performed such that the whole surface is to be filled by the unit of AU. Various patterns can be written by performing blanking control for each of these shots to be "beam on" or "beam off" to be in accordance with a desired pattern.

As described above, in the writing mode (1-2) based on the x direction division, although the writing speed is lower than the case of there being no defective beam, writing processing can be performed without reducing the writing accuracy. Consequently, when the writing mode (1-2) is selected, writing processing can be performed with better efficiency of writing speed than that of in the case using other mode.

Next, for example, when the writing mode (2) is selected, the writing processing control unit 52 controls the writing processing to execute multiple writing while shifting the position, in the state where the defective beam is controlled to be off, by using at least one of the remaining multiple beams, and further to execute an additional writing with respect to a position which was supposed to be written by the defective beam.

Figure 14:
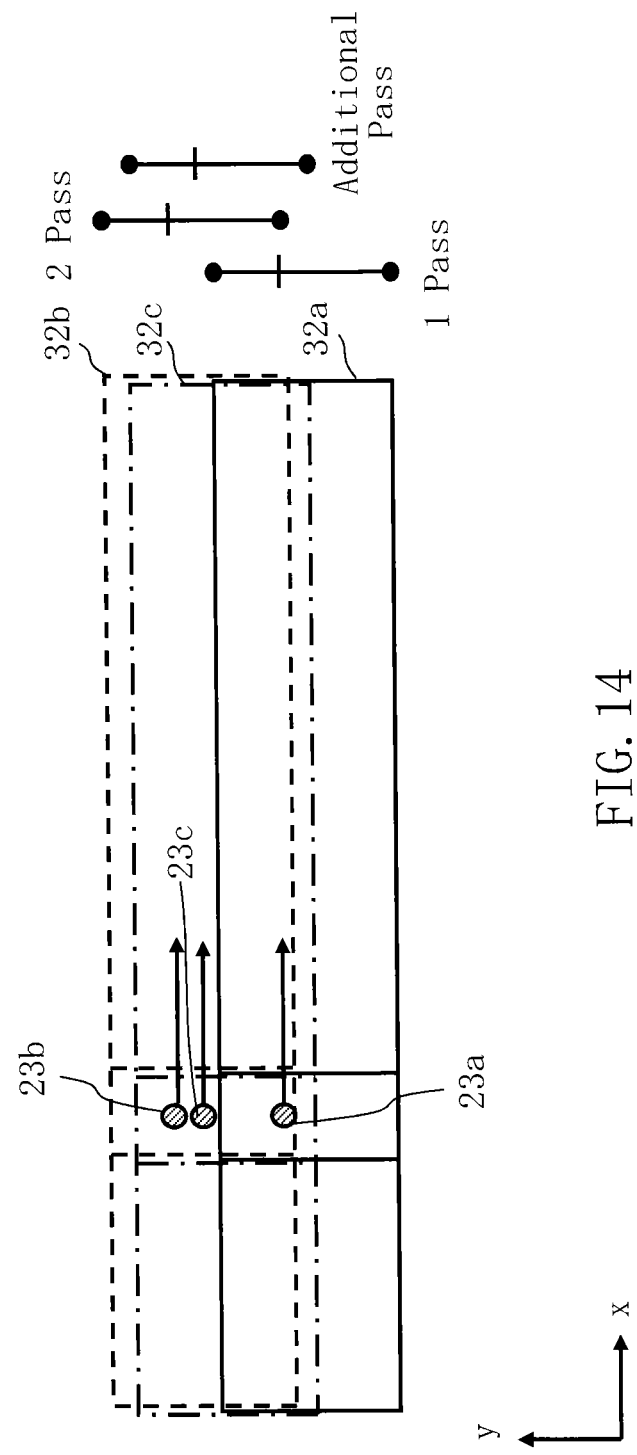
FIG. 14 is a schematic diagram explaining an example in the case of performing writing operation in a writing mode by additional pass writing according to Embodiment 1.

FIG. 14 is a schematic diagram explaining an example in the case of performing writing operation in a writing mode by additional pass writing according to Embodiment 1. FIG. 14 shows the case of the multiplicity being N=2 as an example. In the first and second writing processing in multiple writing, stripe regions which are shifted in the x direction, the y direction, or both the x, and y directions are written. In the example of FIG. 14, the multiple writing is performed while shifting the stripe by ½ of the stripe width in the y direction, for example. In other words, writing processing at each time in the multiple writing is performed while shifting the position in the direction (y direction), which is orthogonal to the writing direction (x direction), from the position of other time of the writing processing. In the first time writing processing, blanking control is performed so that a defective beam may become off, and the first time writing processing is executed for a stripe region 32a by using the remaining multiple beams. The writing operation of raster scanning may be the same as that of the contents explained with reference to FIG. 9, for example. In such a case, no radiation beam is delivered to the position which was supposed to be written by the defective beam having passed through the hole 23a.

Next, the first time writing processing is performed for a stripe region 32b which is shifted from the stripe region 32a, being the target of the first time writing processing, by ½ of the stripe width in the y direction. The writing operation of raster scanning may be the same as that of the contents explained with reference to FIG. 9, for example. In such a case, no radiation beam is delivered to the position which was supposed to be written by the defective beam having passed through the hole 23b.

If this state lasts, each of the position which was supposed to be written by the defective beam having passed through the hole 23a and the position which was supposed to be written by the defective beam having passed through the hole 23b is to be irradiated by only ½ of a desired dose of electron beam.

Then, additional writing is performed for positions supposed to be written by defective beams, namely the position which was supposed to be written by the defective beam having passed through the hole 23a and the position which was supposed to be written by the defective beam having passed through the hole 23b. In that case, in the multiple writing performed by the first time writing processing and the second time writing processing while shifting the position, the position of the writing range to be written in the additional writing is adjusted so that all of plural positions which were supposed to be written by defective beams may be written. In FIG. 14, the writing processing control unit 52 sets a stripe region 32c so that the position which was supposed to be written by the defective beam having passed through the hole 23a and the position which was supposed to be written by the defective beam having passed through the hole 23b may be included in the stripe region 32c. Then, in the additional pass writing, the position which was supposed to be written by the defective beam having passed through the hole 23a and the position which was supposed to be written by the defective beam having passed through the hole 23b are irradiated by other beams except for the defective beams. Here, when writing in the additional pass, although it is possible to form a pattern by performing writing for a portion other than positions which were supposed to be written by defective beams in addition to performing writing for positions which were supposed to be written by defective beams, it is preferable to perform writing only for the positions which were supposed to be written by defective beams. If the writing is performed only for the positions which were supposed to be written by defective beams, generating writing data for other beams becomes unnecessary, thereby having a merit of effectively using the data generation resource.

By the method described above, it is possible to obtain a predetermined dose at any position. Although FIG. 14 describes the case of shifting the writing position of each time writing in the multiple writing in the y direction, it is also acceptable to shift it in the x direction.

Figure 15C:
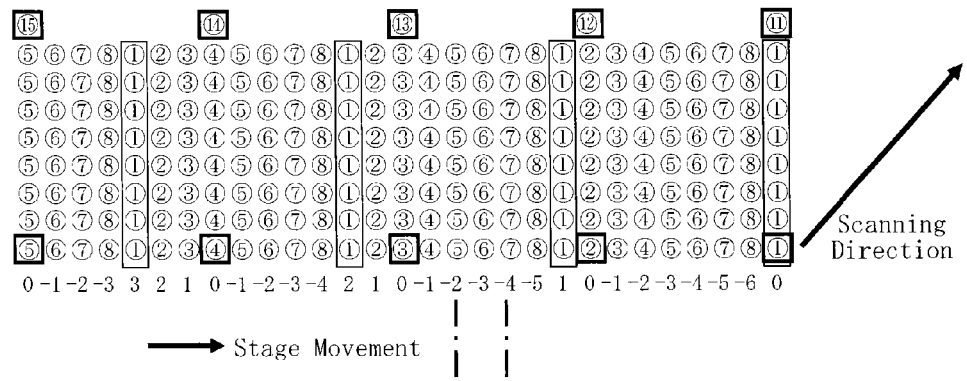
FIGS. 15A to 15C are schematic diagrams explaining another example in the case of performing a writing operation in a writing mode by additional pass writing according to Embodiment 1.
Figure 15B:
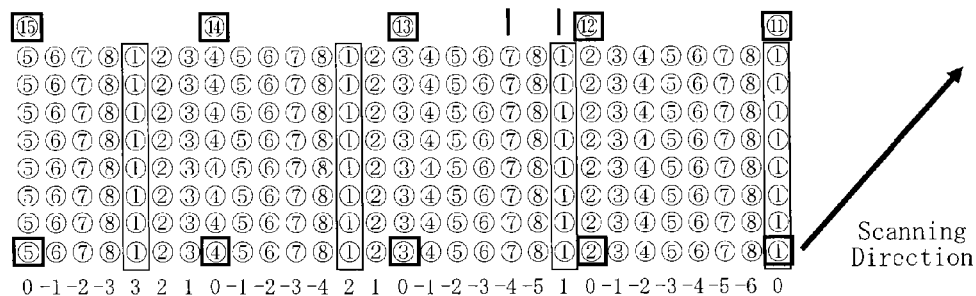
Figure 15A:
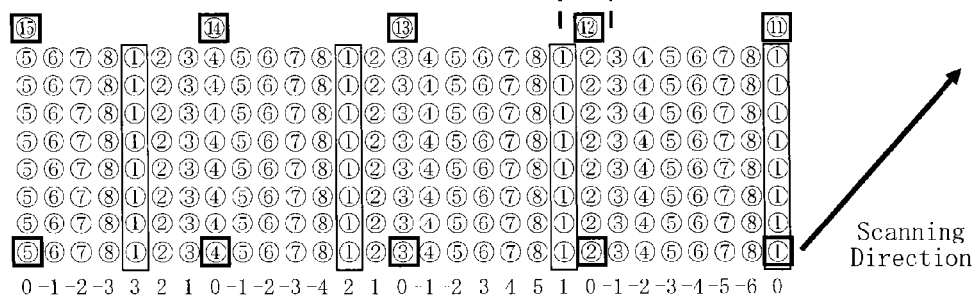

FIGS. 15A to 15C are schematic diagrams explaining another example in the case of performing a writing operation in a writing mode by additional pass writing according to Embodiment 1. FIGS. 15A to 15C show the case of the multiplicity N=2 as an example. The examples of FIGS. 15A to FIG. 15C show the case of performing multiple writing by shifting the writing position by two AUs in the x direction, for example. In the first time writing processing, blanking control is performed to make a defective beam (for example, a beam passing through the hole A denoted by "1") become "beam off" and the first writing processing is executed by using the remaining multiple beams (for example, beams passing through the holes B to H denoted by "2" to "8"), as shown in FIG. 15A. The writing operation of raster scanning may be the same as that of the contents explained with reference to FIG. 9, for example. Thus, in that case, no radiation beam is delivered to the position which was supposed to be written by a defective beam passing through the hole A denoted by "1".

Next, the second time writing processing is started from the position shifted in the x direction by two AUs from the position of the first writing processing as shown in FIG. 15B. The contents of the writing operation may be the same as that of the first time writing processing.

If this state lasts, the position which was supposed to be written by the defective beam having passed through the hole A denoted by "1" is to be irradiated by only ½ of a desired dose.

Then, as the additional pass writing (additional writing), as shown in FIG. 15C, the third time writing processing (additional pass writing) is started from the position shifted in the x direction by two AUs. In that case, other beams except for the defective beams are delivered to the positions which were supposed to be written by the defective beams. In the first, second, and third time writing processing, a predetermined dose can be obtained at any position by performing control so that the position which was supposed to be written by the defective beam passing through the hole A denoted by "1" may not be the same position in each time.

As described above, in the writing mode (3) of the additional pass writing, although the writing speed is lower than the case of there being no defective beam, writing processing can be performed without reducing the writing accuracy. Consequently, when the writing mode (2) is selected, writing processing can be performed with better efficiency of writing speed than that in the case using other mode.

As described above, according to Embodiment 1, it is possible to perform writing processing in a writing mode having better efficiency since a plurality of writing modes are prepared and a writing mode is selected based on the efficiency of writing speed.

As described above, according to Embodiment 1, it is possible to maintain the writing accuracy without increasing the number of beams on the hardware and software even when there exists a defective beam. Moreover, writing can be performed efficiently without decreasing the writing accuracy even if there is a defective beam.

Embodiment 2

In Embodiment 1, there is described the case where the partial region to be set is a quadrangle, but it is not limited thereto. In Embodiment 2, there will be described the case of other shape. Embodiment 2 is the same as Embodiment 1 except for the points specifically described below.

Figure 16:
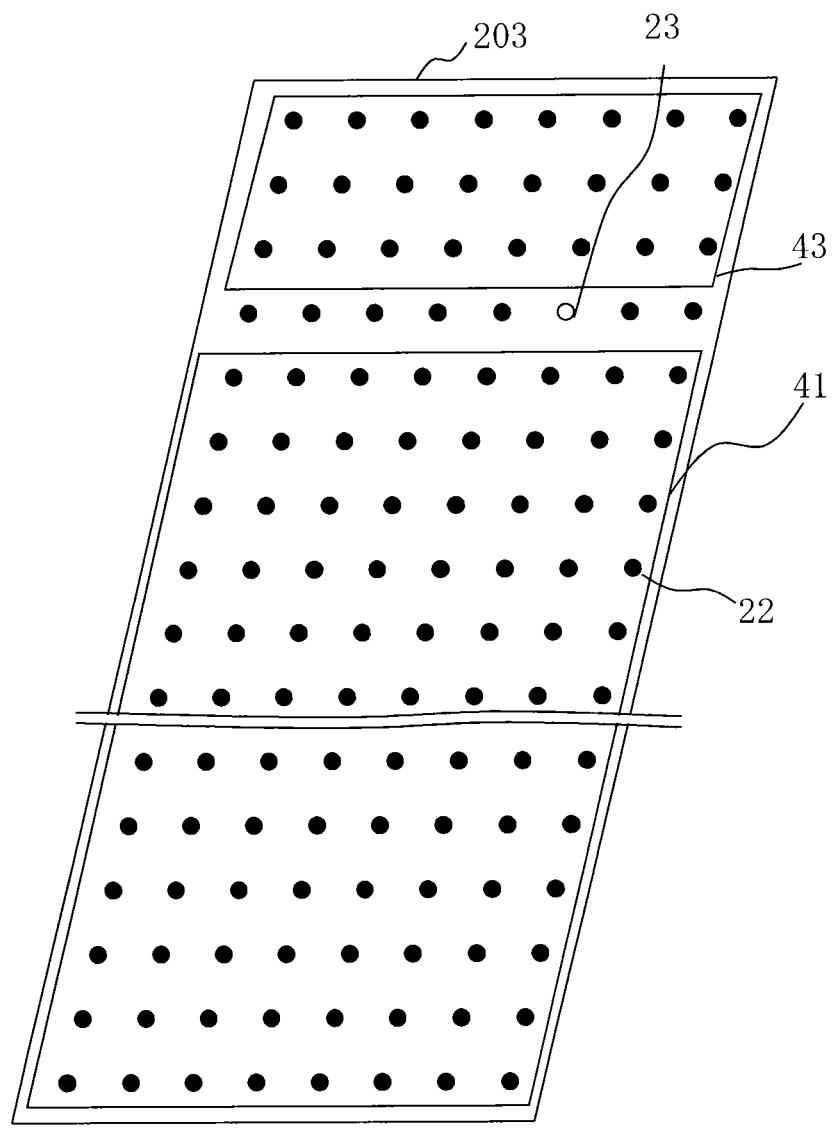
FIG. 16 shows an example of the second region (parallelogram region) based on the y direction division according to Embodiment 2.

FIG. 16 shows an example of the partial region (parallelogram region: second region) based on the y direction division according to Embodiment 2. FIG. 16 shows an example of the aperture member 203 in which the holes 22 are arranged to be five hundred and twelve holes 22 in the vertical direction (the y direction) and eight holes 22 in the horizontal direction (the x direction), wherein, as to each of the rows aligned in the vertical direction (the y direction), the position of holes arranged in the horizontal direction (the x direction) in each row is shifted by a shift dimension "a" in the horizontal direction (the x direction) from that in the row adjacent to the each row. For example, as to the first row and the second row aligned in the vertical direction (the y direction), the position of holes arranged in the horizontal direction (the x direction) is shifted by the shift dimension "a" in the horizontal direction (the x direction). It is also acceptable to change the shift dimension according to the rows, for example, such that the position of holes arranged in the horizontal direction (the x direction) in the second row is shifted from that in the third row by a shift dimension "b" in the horizontal direction (the x direction). As described above, the region including the whole of the holes 22 of the aperture member 203 is a parallelogram. Although the shape of the aperture member 203 itself is a parallelogram in the example of FIG. 16, it may be a rectangle. Moreover as to FIG. 16, for example, the hole 23 which is the sixth from the left end in the x direction and the fourth from the top in the −y direction is a defective beam in the holes 22. In this case, when setting partial regions (parallelogram regions) to be divided to be aligned in the y direction while excluding the defective beam, two partial regions (parallelogram regions) 41 and 43 can be set as shown in FIG. 16: the partial region (parallelogram region) 41 including a plurality of holes 22 of all the columns aligned in the x direction and rows from the fifth row to the bottom, counted from the top, aligned in the −y direction, and the partial region (parallelogram region) 43 including a plurality of holes 22 of all the columns aligned in the x direction and rows from the top to the third row aligned in the −y direction. Comparing the partial regions (parallelogram regions) 41 and 43, since there are more holes 22 in the partial region (parallelogram region) 41, the partial region (parallelogram region) 41 is selected in the case of the y direction division.

Figure 17:
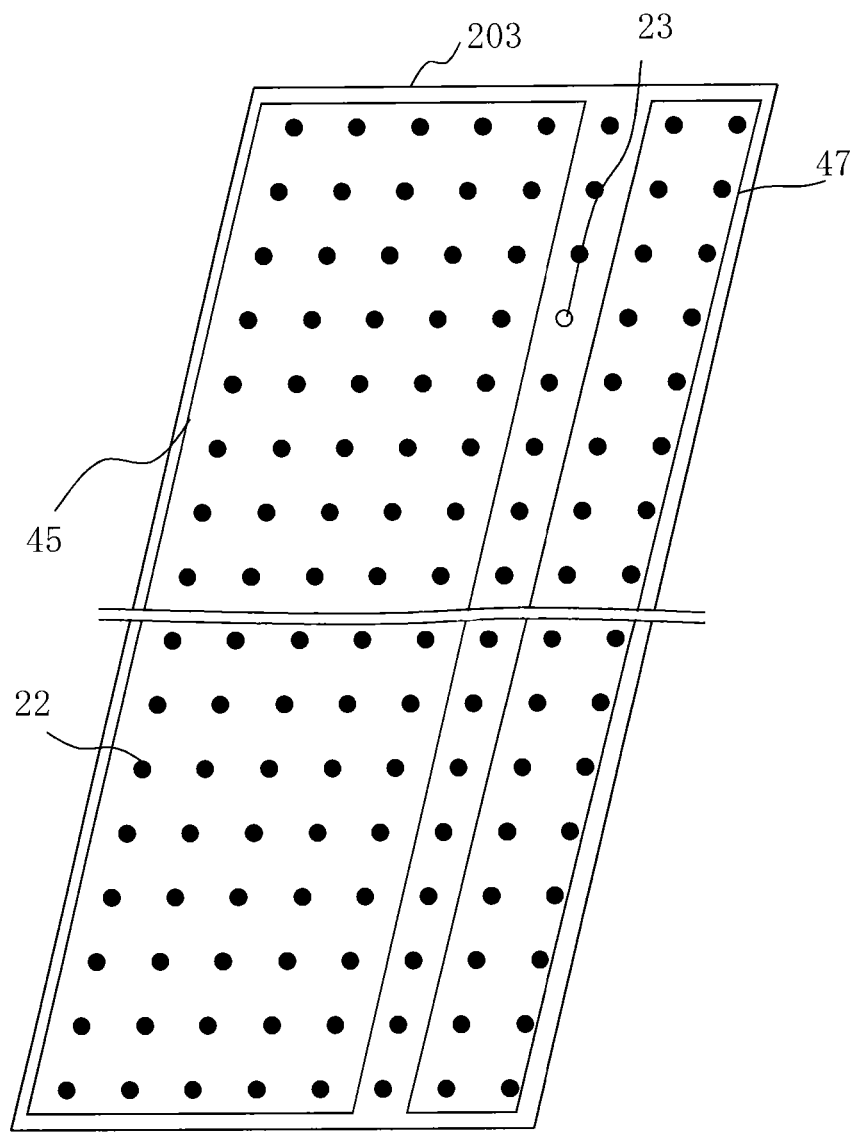
FIG. 17 shows an example of the second region (parallelogram region) based on the x direction division according to Embodiment 2.

FIG. 17 shows an example of the partial region (parallelogram region: second region) based on the x direction division according to Embodiment 2. FIG. 17 shows, similarly to FIG. 16, an example of the aperture member 203 in which the holes 22 are arranged to be five hundred and twelve holes 22 in the vertical direction (the y direction) and eight holes 22 in the horizontal direction (the x direction), wherein the position of holes arranged in the horizontal direction (the x direction) in each row is shifted from that in the row adjacent to the each row by the shift dimension "a" in the horizontal direction (the x direction). For example, in FIG. 17 similarly to FIG. 16, the hole 23 which is the sixth from the left end in the x direction and the fourth from the top in the −y direction is a defective beam in the holes 22. In that case, when setting partial regions (parallelogram regions) to be divided to be aligned in the x direction while excluding the defective beam, two partial regions (parallelogram regions) 45 and 47 can be set as shown in FIG. 17: the partial region (parallelogram region) 45 including a plurality of holes 22 of all the rows aligned in the y direction and columns from the left end to the fifth column aligned in the x direction, and the partial region (parallelogram region) 47 including a plurality of holes 22 of all the rows aligned in the y direction and columns from the seventh column to the right end, counted from the left end, aligned in the x direction. Comparing the partial regions (parallelogram regions) 45 and 47, since there are more holes 22 in the partial region (parallelogram region) 45, the partial region (parallelogram region) 45 is selected in the case of the x direction division.

Figure 18:
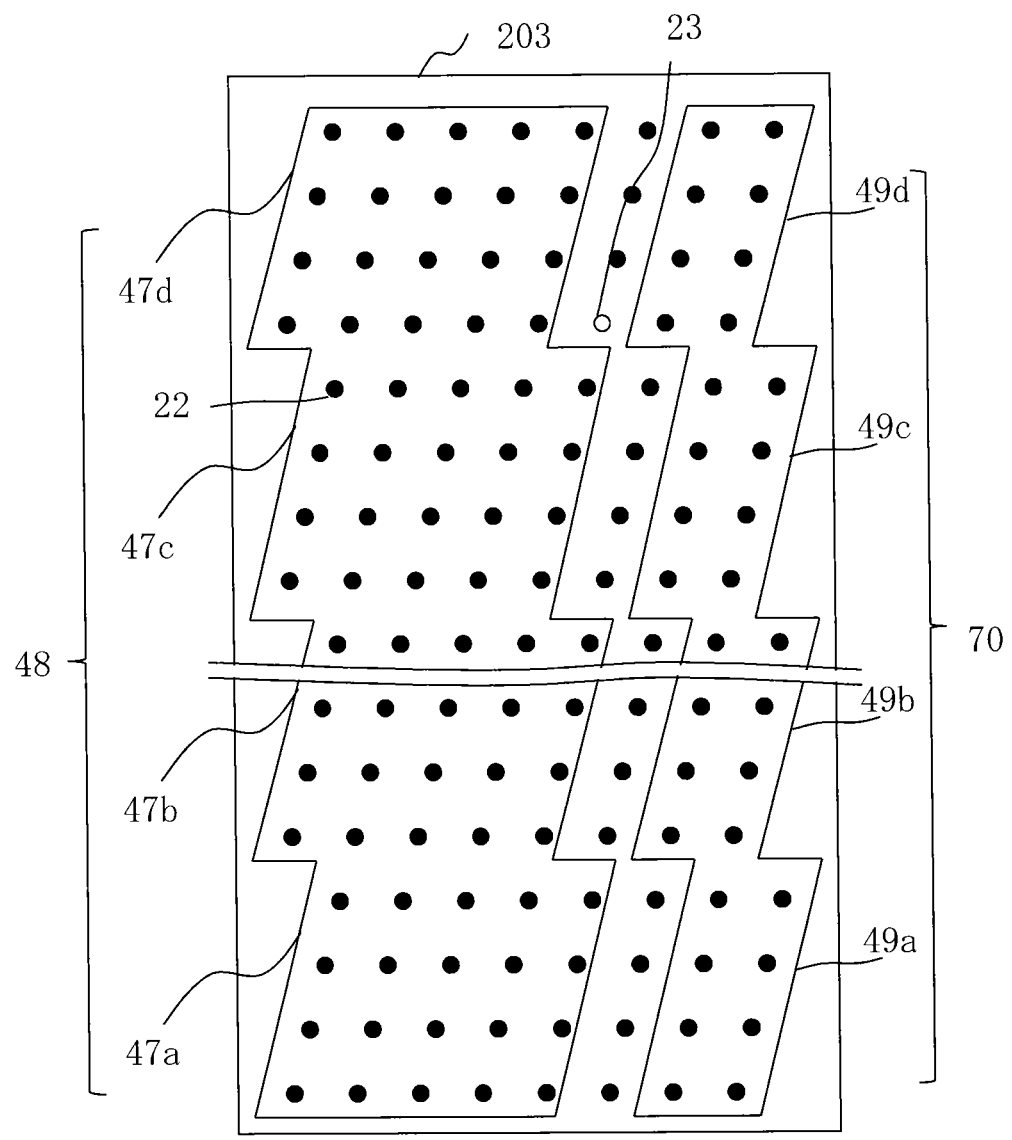
FIG. 18 shows an example of the second region (zigzag region) based on the x direction division according to Embodiment 2.

FIG. 18 shows an example of the partial region (zigzag region: second region) based on the x direction division according to Embodiment 2. FIG. 18 shows an example of the aperture member 203 in which the holes 22 are arranged to be five hundred and twelve holes 22 in the vertical direction (the y direction) and eight holes 22 in the horizontal direction (the x direction), wherein, in a predetermined number of rows, the position of holes arranged in the horizontal direction (the x direction) in each row is shifted from that in the row adjacent to the each row by the shift dimension "a" in the horizontal direction (the x direction), and the position of holes in the row just after the predetermined number of rows returns to the position of the holes arranged in the x direction in the first row in the predetermined number of rows so as to repeat the shifting of the position by the shift dimension "a" in the horizontal direction (the x direction) per row in the predetermined number of rows. For example, in the example of FIG. 18, with respect to the rows from the first row to the fourth row aligned in the vertical direction (the y direction), the position of holes arranged in the horizontal direction (x direction) in each row is shifted from that in the row adjacent to the each row by the shift dimension "a" in the horizontal direction (x direction). In every four rows aligned in the vertical direction (the y direction), such as the rows from the fifth row to the eighth row and the rows from the ninth row to the twelfth row, holes are arranged at the same positions as those in the rows from the first row to the fourth row. In this case, per passage of four rows, the position of holes arranged in the horizontal direction (x direction) is set to be shifted finally to the position of the adjacent holes in the first row. Moreover, in FIG. 18, the hole 23 which is the sixth from the left end in the x direction and the fourth from the top in the −y direction is a defective beam in the holes 22, for example.

In such a case, when setting partial regions (parallelogram regions) to be divided to be aligned in the x direction while excluding the defective beam, two partial regions (zigzag regions) 48 and 70 can be set as shown in FIG. 18: the partial region (zigzag region) 48 is composed of small partial regions (parallelogram regions) 47a, 47b, 47c, . . . , and 47d, wherein the small partial region (parallelogram region) 47a includes a plurality of holes 22 of rows from the bottom to the fourth row aligned in the y direction and columns from the left end to the fifth column aligned in the x direction, the small partial region (parallelogram region) 47b includes a plurality of holes 22 of rows from the fifth row to the eighth row aligned in the y direction and columns from the left end to the fifth column aligned in the x direction, . . . , the small partial region (parallelogram region) 47c includes a plurality of holes 22 of rows from the fifth row to the eighth row, counted from the top, aligned in the −y direction and columns from the left end to the fifth column aligned in the x direction, and the small partial region (parallelogram region) 47d includes a plurality of holes 22 of rows from the first row to the fourth row, counted from the top, aligned in the −y direction and columns from the left end to the fifth column aligned in the x direction, and the partial region (zigzag region) 70 is composed of small partial regions (parallelogram regions) 49a, 49b, . . . , 49c, and 49d, wherein the small partial region (parallelogram region) 49a includes a plurality of holes 22 of rows from the bottom to the fourth row aligned in the y direction and columns from the seventh column to the right end, counted from the left end, aligned in the x direction, the small partial region (parallelogram region) 49b includes a plurality of holes 22 of rows from the fifth row to the eighth row aligned in the y direction and columns from the seventh column to the right end, counted from the left end, aligned in the x direction, . . . , the small partial region (parallelogram region) 49c includes a plurality of holes 22 of rows from the fifth row to the eighth row, counted from the top, aligned in the −y direction and columns from the seventh column to the right end, counted from the left end, aligned in the x direction, and the small partial region (parallelogram region) 49d includes a plurality of holes 22 of rows from the first row to the fourth row, counted from the top, aligned in the −y direction and columns from the seventh column to the right end, counted from left end, aligned in the x direction. In other words, in the x direction division, the partial regions (zigzag regions) 48 and 70 are structured by configuring a plurality of small partial regions (parallelogram regions) while excluding the column where the defective beam (hole 23) exists, and combining the plurality of small partial regions (parallelogram regions) to be in the y direction.

Comparing the partial regions (zigzag regions) 49 and 70, since there are more holes 22 in the partial region (zigzag region) 49, the partial region (zigzag region) 49 is selected in the case of the x direction division. Thus, it is also preferable to set a polygonal region (for example, zigzag region), as a partial region, composed of repeatedly arranged parallelogram regions aligned in the y direction, each of which is configured to include holes 22 for forming beams of m1 beams in the x direction and n1 beams in the y direction.

As described above, when the beam arrangement (arrangement of a plurality of the holes 22 of the aperture member 203) does not go straight in the x and y directions, it is needed to set the shape of a partial region to be in accordance with the arrangement.

Embodiment 3

In Embodiment 2, described is the case of setting a partial region other than a quadrangle when the beam arrangement (arrangement of a plurality of the holes 22 of the aperture member 203) does not go straight in the x and y directions, but it is not limited thereto. In this Embodiment 3, described will be the case of setting a quadrangular partial region even when the beam arrangement (arrangement of a plurality of the holes 22 of the aperture member 203) does not go straight in the x and y directions. Embodiment 3 is the same as Embodiment 1 except for the points specifically described below.

Figure 19:
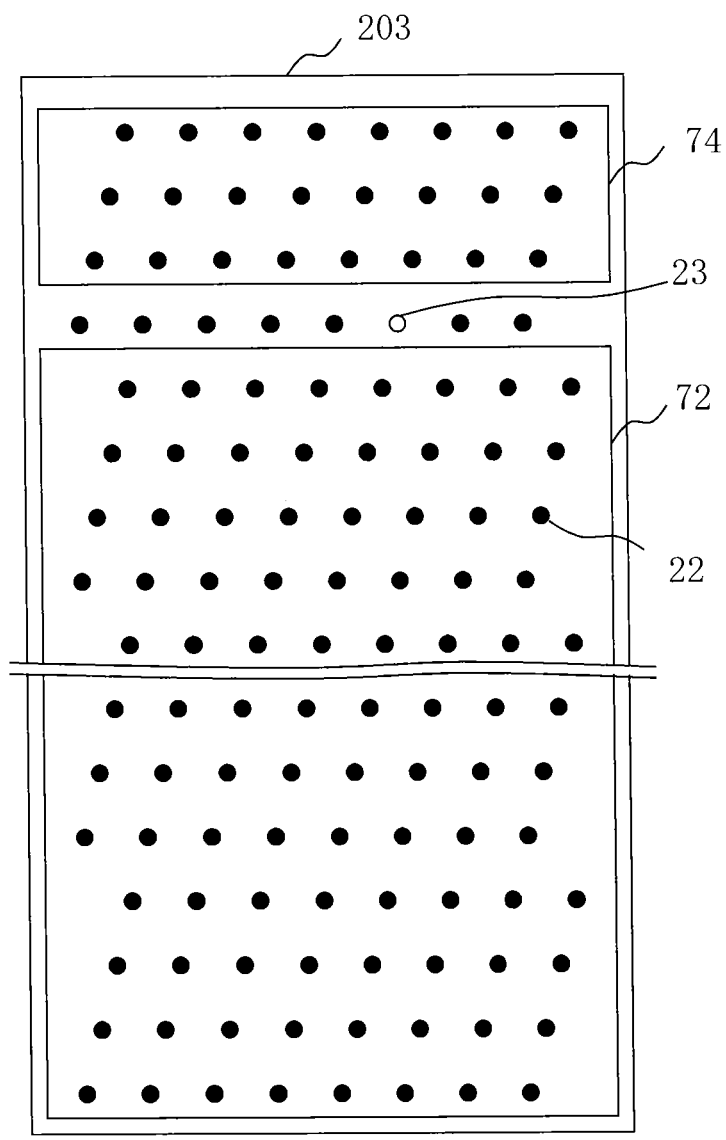
FIG. 19 shows an example of the second region (quadrangular region) based on the y direction division according to Embodiment 3.

FIG. 19 shows an example of a partial region (quadrangular region: second region) based on the y direction division according to Embodiment 3. FIG. 19 shows, similarly to FIG. 18, an example of the aperture member 203 in which the holes 22 are arranged to be five hundred and twelve holes 22 in the vertical direction (the y direction) and eight holes 22 in the horizontal direction (the x direction), for example, wherein, in a predetermined number of rows, the position of holes arranged in the horizontal direction (the x direction) in each row is shifted from that in the row adjacent to the each row by the shift dimension "a" in the horizontal direction (the x direction), and the position of holes in the row just after the predetermined number of rows returns to the position of the holes arranged in the x direction in the first row in the predetermined number of rows so as to repeat the shifting of the position by the shift dimension "a" in the horizontal direction (the x direction) per row in the predetermined number of rows. For example, in the example of FIG. 19, with respect to the rows from the first row to the fourth row aligned in the vertical direction (the y direction), the position of holes arranged in the horizontal direction (x direction) in each row is shifted from that in the row adjacent to the each row by the shift dimension "a" in the horizontal direction (x direction). In every four rows aligned in the vertical direction (the y direction), such as the rows from the fifth row to the eighth row and the rows from the ninth row to the twelfth row, holes are arranged at the same positions as those in the rows from the first row to the fourth row. In this case, per passage of four rows, the position of holes arranged in the horizontal direction (x direction) is set to be shifted finally to the position of the adjacent holes in the first row. Moreover, in FIG. 19, the hole 23 which is the sixth from the left end in the x direction and the fourth from the top in the −y direction is a defective beam in the holes 22.

In such a case, when setting partial regions (parallelogram regions) to be divided to be aligned in the y direction while excluding the defective beam, two partial regions (parallelogram regions) 72 and 74 can be set as shown in FIG. 19: the partial region (quadrangular region) 72 including a plurality of holes 22 of all the columns aligned in the x direction and rows from the fifth row to the bottom row, counted from the top, aligned in the −y direction, and the partial region (quadrangular region) 74 including a plurality of holes 22 of all the columns aligned in the x direction and rows from the top to the third row aligned in the −y direction. Comparing the partial regions (quadrangular regions) 72 and 74, since there are more holes 22 in the partial region (quadrangular region) 72, the partial region (quadrangular region) 72 is selected in the case of the y direction division. In other words, in the y direction division, the partial regions (quadrangular regions) 72 and 74 are configured while excluding the row where the defective beam 23 exists, and the partial region (quadrangular region) 72 in which there are more holes 22 is selected.

As described above, even when the beam arrangement (arrangement of a plurality of the holes 22 of the aperture member 203) does not go straight in the x and y directions, it is possible to set a quadrangle as a partial region.

Thus, in each Embodiment described above, what is necessary is to configure a plurality of partial regions such that the row where the defective beam 23 exists is excluded in the case of the y direction division, and such that the column where the defective beam 23 exists is excluded in the case of the x direction division, and to select a partial region in which there are more holes than other partial region.

Embodiment has been explained referring to concrete examples described above. However, the present invention is not limited to these specific examples. The raster scanning operation described above is just an example, and it is also acceptable to use other operation method instead of the raster scanning operation using multiple beams.

While the apparatus configuration, control method, etc. not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other multi charged particle beam writing apparatus and a method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing method comprising:
   detecting a defective beam in multiple beams having passed through a plurality of openings of an aperture member in which the plurality of openings are formed for forming the multiple beams by irradiation of a charged particle beam;
   setting a region such that more openings in remaining openings except for an opening through which the defective beam passes in the plurality of openings of the aperture member are included in the region;
   selecting a mode from a first mode in which a pattern is written on a target object by using multiple beams that have passed openings in the region and a second mode in which multiple writing is performed while shifting a position by using at least one of remaining multiple beams in a state where the defective beam is controlled to be beam off and additional writing is performed for a position which was supposed to be written by the defective beam; and
   writing a pattern on a target object in the mode selected.

2. The method according to claim 1 further comprising:
calculating efficiency of writing speed in a case of performing writing in the first mode.

3. The method according to claim 2 further comprising:
calculating efficiency of writing speed in a case of performing writing in the second mode.

4. The method according to claim 3 further comprising:
judging a mode having best efficiency between the efficiency of the first mode and the efficiency of the second mode.

* * * * *